(12) United States Patent
Kim et al.

(10) Patent No.: US 9,099,403 B2
(45) Date of Patent: Aug. 4, 2015

(54) METHODS FOR FORMING A SEMICONDUCTOR DEVICE INCLUDING FINE PATTERNS

(71) Applicants: Nam-Gun Kim, Suwon-si (KR); Kyungho Jang, Hwaseong-si (KR)

(72) Inventors: Nam-Gun Kim, Suwon-si (KR); Kyungho Jang, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/098,897

(22) Filed: Dec. 6, 2013

(65) Prior Publication Data

US 2014/0162461 A1 Jun. 12, 2014

(30) Foreign Application Priority Data

Dec. 6, 2012 (KR) ........................ 10-2012-0141004

(51) Int. Cl.
| | | |
|---|---|---|
| H01L 21/311 | (2006.01) | |
| H01L 21/033 | (2006.01) | |
| H01L 45/00 | (2006.01) | |
| H01L 27/22 | (2006.01) | |
| H01L 27/24 | (2006.01) | |
| H01L 27/108 | (2006.01) | |
| H01L 27/115 | (2006.01) | |

(52) U.S. Cl.
CPC ...... *H01L 21/31144* (2013.01); *H01L 21/0337* (2013.01); *H01L 27/228* (2013.01); *H01L 27/2436* (2013.01); *H01L 27/2472* (2013.01); *H01L 45/06* (2013.01); *H01L 45/10* (2013.01); *H01L 45/1233* (2013.01); *H01L 45/146* (2013.01); *H01L 45/147* (2013.01); *H01L 27/10852* (2013.01); *H01L 27/11556* (2013.01); *H01L 27/11582* (2013.01)

(58) Field of Classification Search
CPC ............ H01L 27/2472; H01L 27/1556; H01L 21/3086; H01L 45/147
USPC ............................... 438/708, 717; 216/47, 51
See application file for complete search history.

(56) References Cited

U.S. PATENT DOCUMENTS

| | | | |
|---|---|---|---|
| 6,756,283 B2 | 6/2004 | Green et al. | |
| 7,749,902 B2 | 7/2010 | Kim et al. | |
| 8,222,152 B2 | 7/2012 | Sun | |
| 8,241,838 B2 | 8/2012 | Yoshino | |
| 8,308,966 B2 | 11/2012 | Sun et al. | |
| 8,647,981 B1* | 2/2014 | Sipani ........................ 438/675 |
| 2007/0048674 A1* | 3/2007 | Wells ........................ 430/313 |
| 2009/0311865 A1 | 12/2009 | Wang | |
| 2012/0040528 A1 | 2/2012 | Kim et al. | |
| 2014/0162458 A1* | 6/2014 | Khurana et al. ............. 438/696 |

FOREIGN PATENT DOCUMENTS

| | | |
|---|---|---|
| JP | 2010-161314 | 7/2010 |
| KR | 1020090070686 | 7/2009 |
| KR | 1020110077484 | 7/2011 |

* cited by examiner

*Primary Examiner* — Caridad Everhart
(74) *Attorney, Agent, or Firm* — Myers Bigel Sibley & Sajovec, P.A.

(57) ABSTRACT

Methods for forming a semiconductor device including fine patterns are provided. The method may include forming a mask layer including first holes spaced apart from each other in a first direction and a second direction. The method may also include forming local mask patterns on the mask layer and forming a sacrificial layer on the mask layer filling the first holes and surrounding the local mask patterns. The local mask patterns may be offset from the first holes in the first direction and the second direction. The method may further include removing the local mask patterns to form openings in the sacrificial layer exposing the mask layer and etching the mask layer through the opening to form second holes in the mask layer.

29 Claims, 33 Drawing Sheets

METHODS FOR FORMING A SEMICONDUCTOR DEVICE INCLUDING FINE PATTERNS

CROSS-REFERENCE TO RELATED APPLICATIONS

This U.S. non-provisional patent application claims priority under 35 U.S.C. §119 to Korean Patent Application No. 10-2012-0141004, filed on Dec. 6, 2012, in the Korean Intellectual Property Office, the disclosure of which is hereby incorporated by reference herein in its entirety.

FIELD

The present disclosure generally relates to the field of electronics and, more particularly, to semiconductor devices.

BACKGROUND

Since sizes of individual elements in highly integrated semiconductor devices may need to be reduced in order to integrate a lot of elements in a limited area, fine patterns may be beneficial to manufacture the highly integrated semiconductor devices. To achieve this, a pitch of patterns for realizing the elements may also need to be reduced. A pitch of patterns corresponds to a sum of a width of each of the patterns and a space between two adjacent patterns. However, as a design rule of the semiconductor device becomes rapidly reduced, patterns having a fine pitch may be difficult to be formed due to a resolution limit of a photolithography process for forming the patterns of the semiconductor device.

SUMMARY

A method for forming a semiconductor device may include forming a hard mask layer including a plurality of first holes spaced apart from each other in a first direction and a second direction on a substrate and forming a plurality of local mask patterns on the hard mask layer. The plurality of local mask patterns may be offset from the plurality of first holes in the first direction and the second direction. The method may also include forming a sacrificial layer on the hard mask layer filling the plurality of first holes and surrounding the plurality of local mask patterns, removing the plurality of local mask patterns to form a plurality of openings in the sacrificial layer exposing portions of the hard mask layer and anisotropically etching the portions of the hard mask layer to form a plurality of second holes.

According to various embodiments, forming the hard mask layer including the plurality of first holes may include forming a plurality of first line mask patterns extending in the first direction on the hard mask layer, forming a plurality of second line mask patterns crossing over the plurality of first line mask patterns and anisotropically etching the hard mask layer using the pluralities of first and second line mask patterns as an etch mask. A width of each of the plurality of first line mask patterns may be equal to a width of each of the plurality of second line mask patterns.

In various embodiments, forming the plurality of local mask patterns may include performing a blanket anisotropic etching process on the pluralities of first and second line mask patterns to leave portions of the plurality of first line mask patterns overlapped by the plurality of second line mask patterns.

In various embodiments, forming the plurality of local mask patterns may include etching the plurality of first line mask patterns to leave portions of the plurality of first line mask patterns under the plurality of second line mask patterns.

According to various embodiments, the method may further include forming a plurality of spacers on respective ones of sidewalls of the pluralities of first and second holes.

According to various embodiments, the method may further include forming a lower layer between the substrate and the hard mask layer and anisotropically etching the lower layer using the hard mask layer including the pluralities of first and second holes as an etch mask to form pluralities of first and second lower holes in the lower layer. In various embodiments, the method may additionally include filling each of the pluralities of first and second lower holes in the lower layer with a filling material to form a plurality of fine patterns in respective ones of the pluralities of first and second lower holes and removing the lower layer. The plurality of fine patterns may be arranged in zigzag pattern.

A method for forming a semiconductor device may include forming a plurality of first line mask patterns extending in a first direction on a hard mask layer and forming a plurality of second line mask patterns on the plurality of first line mask patterns extending in a second direction perpendicular to the first direction. The hard mask layer may include a plurality of first regions exposed by the pluralities of first and second line mask patterns and a plurality of second regions overlapped by the pluralities of first and second line mask patterns. The method may also include forming a plurality of first holes by etching the plurality of first regions of the hard mask layer and forming a plurality of second holes by etching the plurality of second regions of the hard mask layer.

In various embodiments, a width of each of the plurality of first line mask patterns may be equal to a width of each of the plurality of second line mask patterns.

According to various embodiments, forming the plurality of second holes may include forming a plurality of local mask patterns in the plurality of second regions by etching the plurality of first line mask patterns after the plurality of first holes are formed, forming a sacrificial layer on the hard mask layer filling the plurality of first holes and surrounding the plurality of local mask patterns, selectively removing the plurality of local mask patterns to form a plurality of openings exposing portions of the hard mask layer and anisotropically etching the portions of the hard mask layer.

In various embodiments, the pluralities of first and second line mask patterns may have an etch selectivity with respect to the hard mask layer The first and second line mask patterns may include a same material and forming the local mask patterns may include anisotropically etching the pluralities of first and second line mask patterns concurrently.

According to various embodiments, each of the plurality of first line mask patterns may be thinner than each of the plurality of second line mask patterns.

According to various embodiments, the plurality of first line mask patterns may have an etch selectivity with respect to the plurality of second line mask patterns. In various embodiments, forming the plurality of local mask patterns may include anisotropically etching the plurality of first line mask patterns using the plurality of second line mask patterns as an etch mask and removing the plurality of second line mask patterns.

According to various embodiments, the method may further include forming a plurality of spacers on respective ones of sidewalls of the pluralities of first and second holes.

A method for forming a semiconductor device may include forming a plurality of first line mask patterns extending in a first direction on a hard mask layer, forming a plurality of second line mask patterns on the plurality of first line mask patterns extending in a second direction perpendicular to the first direction, forming a plurality of first holes in the hard mask layer by using the pluralities of first and second line mask patterns as an etch mask, forming a plurality of local mask patterns by etching the plurality of first line mask patterns exposed by the plurality of second line mask patterns and forming a sacrificial layer on the hard mask pattern filling the plurality of first holes and surrounding the plurality of local mask patterns. The method may also include removing the plurality of local mask patterns to form a plurality of openings in the sacrificial layer. The plurality of openings may expose an upper surface of the hard mask layer. The method may further include etching the hard mask layer through the plurality of openings in the sacrificial layer to form a plurality of second holes in the hard mask layer.

According to various embodiments, the pluralities of first and second line mask patterns may have an etch selectivity with respect to the hard mask layer, the pluralities of first and second line mask patterns may include a same material, and forming the local mask patterns may include anisotropically etching the pluralities of first and second line mask patterns concurrently.

According to various embodiments, the plurality of first line mask patterns may have an etch selectivity with respect to the plurality of second line mask patterns. Forming the plurality of local mask patterns may include anisotropically etching the plurality of first line mask patterns using the plurality of second line mask patterns as an etch mask and removing the plurality of second line mask patterns.

According to various embodiments, the method may further include, forming a first organic mask layer disposed on the hard mask layer before forming the plurality of second line mask patterns. The first organic mask layer may include a plurality of trenches between two adjacent ones of the plurality of first line mask patterns. The method may also include forming a plurality of second organic mask patterns in respective ones of the plurality of trenches of the first organic mask layer.

In various embodiments, before forming the plurality of first holes, the method may further include anisotropically etching the first organic mask layer and the plurality of second organic mask patterns until the hard mask layer is exposed.

In various embodiments, the method may further include forming a plurality of spacers on respective ones of sidewalls of the pluralities of first and second holes.

A method of forming an integrated circuit device may include forming a mask layer on a substrate, forming a plurality of first line patterns extending in a first direction on the mask layer and forming a plurality of second line patterns on the mask layer and the plurality of first line patterns. The plurality of second line patterns may extend in a second direction different from the first direction. The method may also include forming a plurality of first holes in the mask layer by etching the mask layer exposed by the pluralities of first and second line patterns and forming a plurality of local mask patterns by etching the plurality of first line patterns exposed by the plurality of second line patterns. The plurality of local mask patterns may include remaining portions of the plurality of first line patterns. The method may further include forming a sacrificial layer on the mask layer surrounding the plurality of local mask patterns so as to expose uppermost surfaces of the plurality of local mask patterns, forming a plurality of second holes in the sacrificial layer exposing the mask layer by removing the plurality of local mask patterns and forming a plurality of third holes in the mask layer by etching the mask layer through the plurality of second holes.

According to various embodiments, the first direction may be perpendicular to the second direction. In various embodiments, the mask layer may include a hard mask layer.

According to various embodiments, the method may additionally include forming an etch stop layer between the substrate and the mask layer, and the etch stop layer may have an etch selectivity with respect to the mask layer.

According to various embodiments, forming the plurality of second holes may include forming a plurality of preliminary holes in the sacrificial layer exposing the mask layer by removing the plurality of local mask patterns and forming a plurality of spacers on respective ones of sidewalls of the plurality of preliminary holes.

In various embodiments, the method may additionally include forming a plurality of spacers on respective ones of sidewalls of the pluralities of first and third holes in the mask layer.

According to various embodiments, forming the plurality of first line patterns and forming the plurality of second line patterns may include forming an organic mask layer on the mask layer, forming a plurality of first mask line patterns extending in the first direction on the organic mask layer, forming the plurality of second line patterns on the organic mask layer and the plurality of first mask line patterns and forming an organic mask pattern by etching the organic mask layer exposed by the plurality of first mask line patterns and the plurality of second line patterns until the mask layer is exposed. An upper surface defined by the organic mask layer and the plurality of first mask line patterns may flat, and the organic mask layer may have an etching selectivity with respect to the plurality of first mask line patterns and the plurality of second line patterns.

In various embodiments, forming the organic mask layer and forming the plurality of first mask line patterns may include forming a first organic mask layer on the mask layer, forming a preliminary mask layer on the first organic mask layer, forming a plurality of trenches extending in the first direction by etching the preliminary mask layer and the first organic mask layer and forming a second organic mask layer in the plurality of trenches. The first and second organic mask layers may include the organic mask layer. The plurality of first mask line patterns may include remaining portions of the preliminary mask layer.

According to various embodiments, the method may additionally include forming a plurality of preliminary local mask patterns by concurrently etching the plurality of second line patterns and the plurality of first mask line patterns exposed by the plurality of second line patterns. The plurality of preliminary local mask patterns may include remaining portions of the plurality of first mask line patterns.

In various embodiments, forming the plurality of first holes in the mask layer may include etching the mask layer using the plurality of preliminary local mask patterns and the organic mask patterns as an etching mask.

In various embodiments, forming the plurality of local mask patterns may include etching the organic mask pattern using the plurality of preliminary local mask patterns as an etching mask until the mask layer is exposed. The plurality of local mask patterns may include respective ones of the plurality of preliminary local mask patterns and remaining portions of the organic mask pattern under the respective ones of the plurality of preliminary local mask patterns.

According to various embodiments, forming the organic mask layer may include forming an organic layer including carbon and a carbon content may be in a range of about 80 wt % to about 99 wt %.

According to various embodiments, forming the plurality of first holes in the mask layer may include etching the mask layer using the pluralities of first and second line patterns as an etch mask.

In various embodiments, forming the plurality of local mask patterns may include etching the plurality of first line patterns using the plurality of second line patterns as an etch mask and removing the plurality of second line patterns. The plurality of first line patterns may have an etching selectivity with respect to the plurality of second line patterns.

DETAILED DESCRIPTION OF THE EMBODIMENTS

Figure 1:
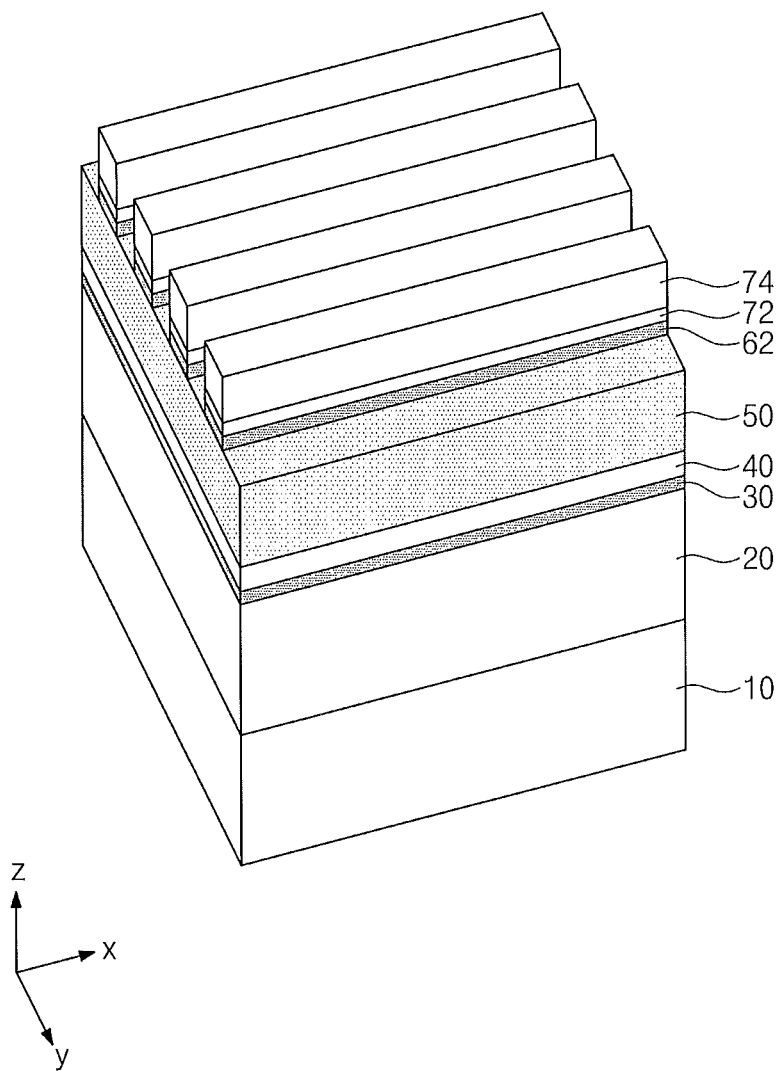
FIGS. 1 to 16 are perspective views illustrating intermediate structures provided in operations of forming a semiconductor device according to some embodiments of the present inventive concepts.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, a region or a substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, steps, operations, elements, and/or components, but do not preclude the presence or addition of one or more other features, steps, operations, elements, components, and/or groups thereof.

Example embodiments of the inventive concepts are described herein with reference to cross-sectional illustrations and/or plane illustrations that are schematic illustrations of idealized embodiments and intermediate structures of example embodiments. As such, variations from the shapes of the illustrations as a result, for example, of manufacturing techniques and/or tolerances, are to be expected. For example, an etching region illustrated as a rectangle will, typically, have rounded or curved features. Thus, example embodiments of the inventive concepts should not be construed as limited to the particular shapes illustrated herein but include deviations in shapes that result, for example, from manufacturing.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Hereinafter, methods for forming a semiconductor device including fine patterns according to some embodiments of the present inventive concept will be described in detail with reference to the drawings. Fine patterns may be arranged in various ways in a semiconductor device. If the fine patterns are arranged in a square form, it may be difficult to increase widths (e.g., diameters) of the fine patterns within a limited area. However, if the fine patterns are arranged in zigzag pattern or honeycomb form, a space between the fine patterns may become greater than a space between the fine patterns arranged in the square form. Thus, widths of the fine patterns arranged in zigzag pattern or honeycomb form may become greater than width of the fine patterns arranged in the square form.

Thus, embodiments of the present inventive concept provide methods for forming fine patterns of the zigzag or honeycomb form by using line-and-space patterns perpendicularly crossing each other. Additionally, embodiments of the present inventive concept provide methods capable of preventing the distance between the fine patterns arranged in zigzag pattern and the diameters of the fine patterns from being varied by a poor overlay distribution when the fine patterns are formed using the line-and-space patterns perpendicularly crossing each other.

Figure 17:
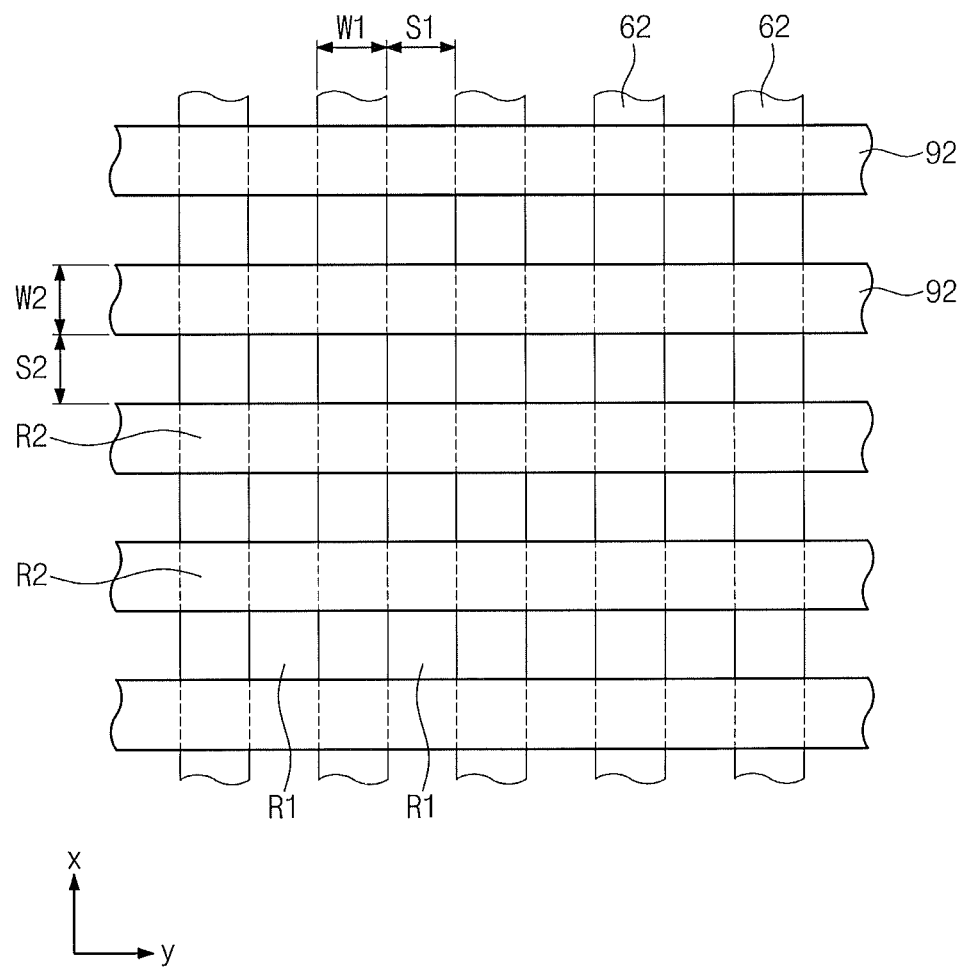
FIGS. 17 to 19 are plan views illustrating intermediate structures provided in operations of forming a semiconductor device according to some embodiments of the present inventive concepts.
Figure 18:
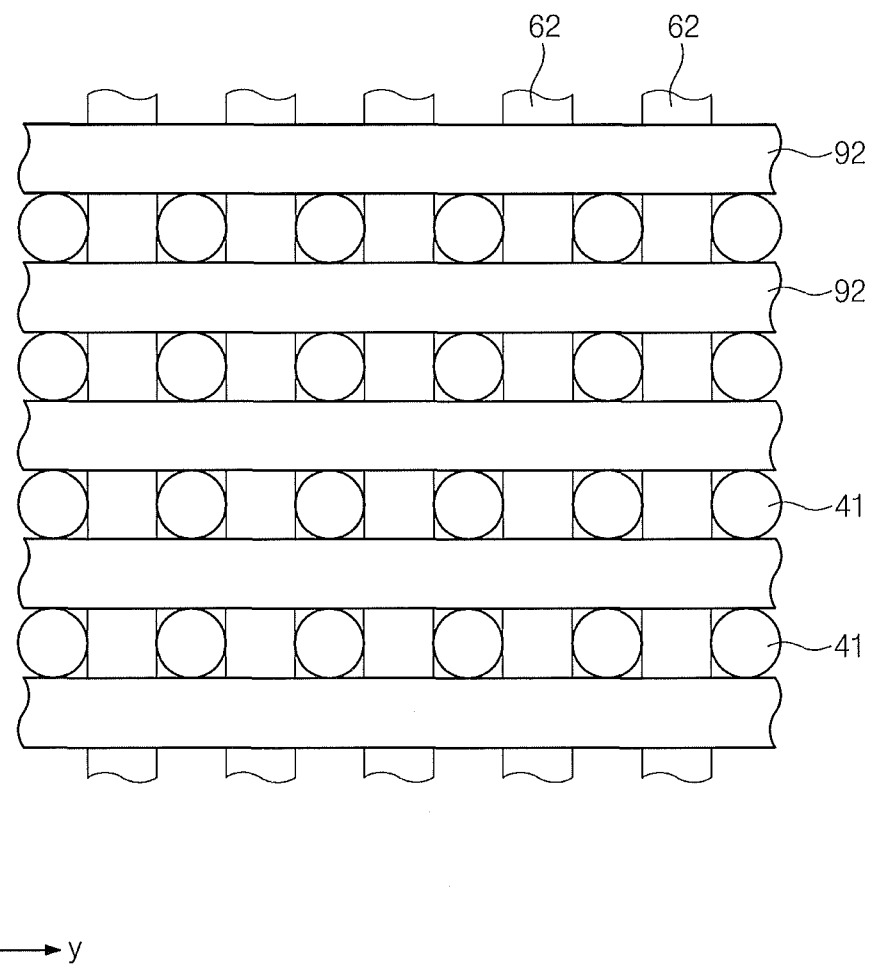
Figure 19:
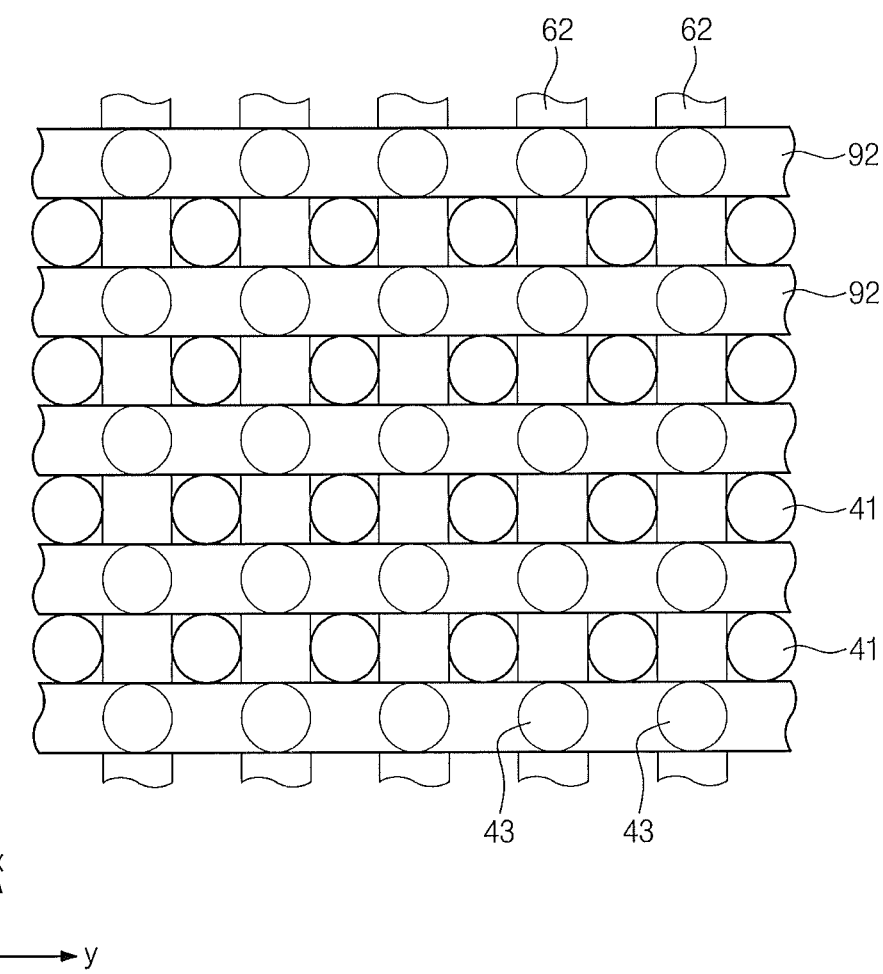
Figure 20:
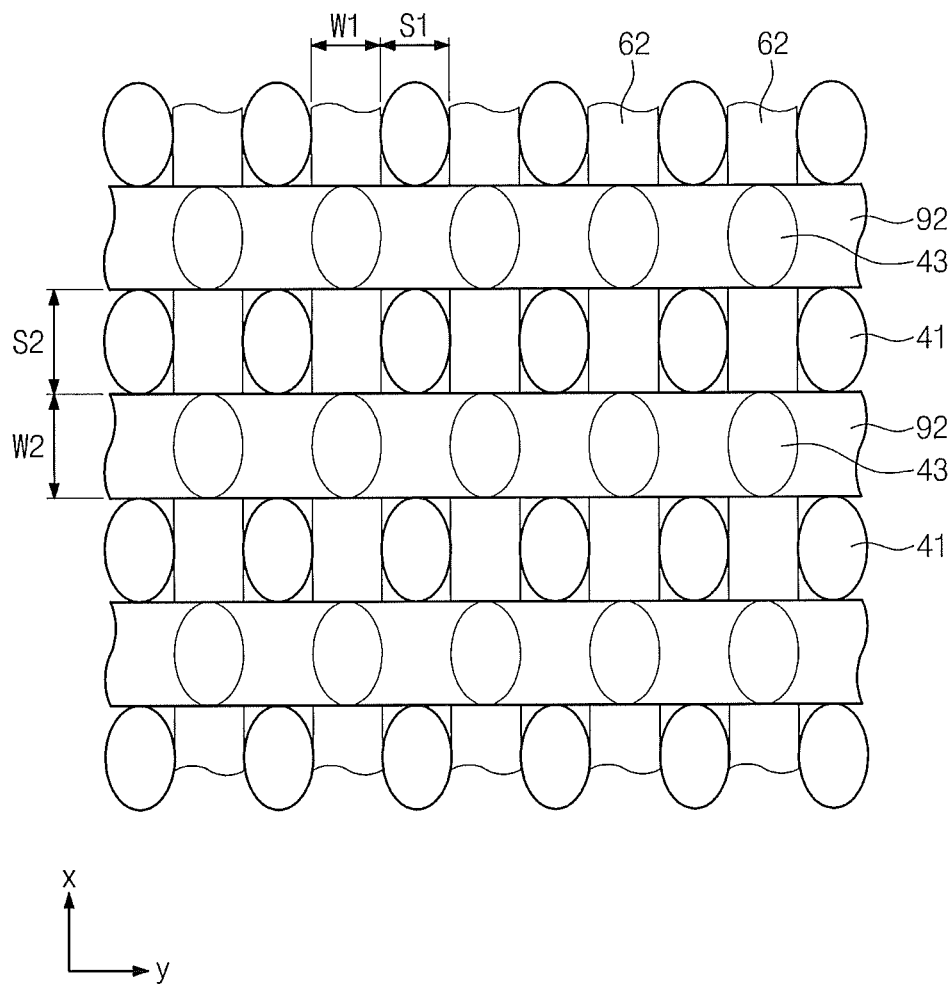
FIG. 20 is a plan view illustrating intermediate structures provided in operations of forming a semiconductor device according to some embodiments of the present inventive concepts.

FIGS. 1 to 16 are perspective views illustrating intermediate structures provided in operations of forming a semiconductor device according to some embodiments of the present inventive concepts. FIGS. 17 to 19 are plan views illustrating intermediate structures provided in operations of forming a semiconductor device according to some embodiments of the present inventive concepts. FIG. 20 is a plan view illustrating intermediate structures provided in operations of forming a semiconductor device according to some embodiments of the present inventive concepts.

Referring to FIG. 1, a lower layer 20, an etch stop layer 30, and a hard mask layer 40 may be sequentially formed on a substrate 10. In some embodiments, the lower layer 20 may be formed of a semiconductor material, a conductive material, an insulating material, or any combination thereof. If the lower layer 20 is formed of the semiconductor material, the lower layer 20 may be a semiconductor substrate or an epitaxial layer. If the lower layer 20 is formed of the conductive material, the lower layer 20 may be formed of doped poly-silicon, metal silicide, metal, metal nitride, or any combination thereof. If the lower layer 20 is formed of the insulating material, the lower layer 20 may be formed of silicon oxide, silicon nitride, silicon oxynitride, or low-k dielectric material having a low dielectric constant. Alternatively, the lower layer 20 may be formed of crystalline silicon, amorphous silicon, silicon doped with dopants, silicon-germanium, or carbon-based material.

Additionally, the lower layer 20 may be formed of a single-layer, or a multi-layer including a plurality of stacked layers. For example, the lower layer 20 may include a plurality of stacked insulating layers and a conductive layer or a semiconductor layer disposed between the stacked insulating layers. Alternatively, the lower layer 20 may include at least one of a semiconductor pattern, a conductive pattern, and an insulating pattern.

The etch stop layer 30 may be formed of a material having an etch selectivity with respect to the lower layer 20 and the hard mask layer 40. For example, the etch stop layer 30 may be formed of silicon oxide ($SiO_2$), silicon oxynitride (SiON), silicon nitride ($Si_3N_4$), silicon-carbon nitride (SiCN), or silicon carbide (SiC).

The hard mask layer 40 may be formed of a material having an etch selectivity with respect to the lower layer 20 in a process of etching the lower layer 20. For example, the hard mask layer 40 may be formed of at least one of silicon containing materials such as poly-silicon, silicon oxynitride (SiON), silicon nitride ($Si_3N_4$), and silicon-carbon nitride (SiCN). In some embodiments, the hard mask layer 40 may be formed of poly-silicon.

In some embodiments, a first organic mask layer 50 may be formed on the hard mask layer 40. The first organic mask layer 50 may be formed of a material having an etch selectivity with respect to the hard mask layer 40 in a process of etching the hard mask layer 40. In more detail, the first organic mask layer 50 may be formed of a material including carbon as its main ingredient. The first organic mask layer 50 may have a carbon content of about 80 wt % to about 99 wt % with respect to the total weight of a compound constituting the first organic mask layer 50. The first organic mask layer 50 may be deposited on the hard mask layer 40 by a chemical vapor deposition (CVD) method. The first organic mask layer 50 may have a thickness of about 1000 Å to about 10000 Å. In some embodiments, the first organic mask layer 50 may be an amorphous carbon layer formed by the CVD method. In some embodiments, the first organic mask layer 50 may be formed of photoresist or amorphous silicon.

Referring to FIGS. 1 and 17, first line mask patterns 62 may be formed on the first organic mask layer 50. The first line mask patterns 62 may extend in a first direction, for example an x-axis direction in FIG. 1.

In some embodiments, forming the first line mask patterns 62 may include forming a first mask layer on the first organic mask layer 50, forming first photoresist patterns 74 on the first mask layer, and etching the first mask layer using the first photoresist patterns 74 as etch masks. The first mask layer may be formed by a deposition method (e.g., a CVD process) or a spin-coating method. A photoresist material may be coated on the first mask layer to form a first photoresist layer. An exposure process and a development process may be performed on the first photoresist layer, thereby forming the first photoresist patterns 74. In some embodiments, a photolithography process for forming line-and-space patterns may be performed on the first photoresist layer.

Additionally, first anti-reflective patterns 72 may be formed between the first mask layer and the first photoresist patterns 74 in order to form the first line mask patterns 62. The first anti-reflective patterns 72 may be formed of a material that has an etch selectivity with respect to the first mask layer and may absorb light to reduce reflection of the light during the exposure process. The first anti-reflective patterns 72 may be formed of an organic compound or an inorganic compound. In some embodiments, the first anti-reflective patterns 72 may be formed of an organic material having an etching property similar to that of photoresist. Since the first anti-reflective patterns 72 are formed between the first mask layer and the first photoresist patterns 74, it is possible to reduce variations in widths of the first photoresist patterns 74 by reflection and scattering of the light irradiated to the first photoresist layer in the photolithography process for forming the first photoresist patterns 74.

The first line mask patterns 62 may be repeatedly arranged at regular pitches on the first organic mask layer 50. In some embodiments of the present inventive concept, diameters (or widths) of desired fine patterns may be varied depending on the pitch of the first line mask patterns 62. In some embodiments, as illustrated in FIG. 17, a width W1 of the first line mask pattern 62 may be substantially equal to a space S1 between the first line mask patterns 62. In other words, the pitch of the first line mask patterns 62 may be substantially twice the width W1 of the first line mask pattern 62. In some embodiments, a thickness of the first line mask pattern 62 may have a range of about 10% to about 50% of a thickness of the first organic mask layer 50. For example, the first line mask patterns 50 may have a thickness of about 300 Å to about 600 Å on the first organic mask layer 50.

According to some embodiments of the present inventive concept, the first line mask patterns 62 may be formed of a material having an etch selectivity with respect to the first organic mask layer 50. For example, a ratio of an etch rate of the first organic mask layer 50 to an etch rate of the first line mask patterns 62 may be about 10:1 or more. In other words, the etch rate of the first organic mask layer 50 may be greater than that of the first line mask patterns 62 in a process of etching the first organic mask layer 50. Thus, the first line mask patterns 62 may not be removed before the process of the etching the first organic mask layer 50 is finished. In some embodiments, the first line mask patterns 62 may be formed of any one of silicon containing materials such as silicon oxynitride (SiON), silicon oxide (SiO2), silicon nitride (Si3N4), and silicon-carbon nitride (SiCN), silicon carbide (SiC), and poly-silicon.

Figure 2:
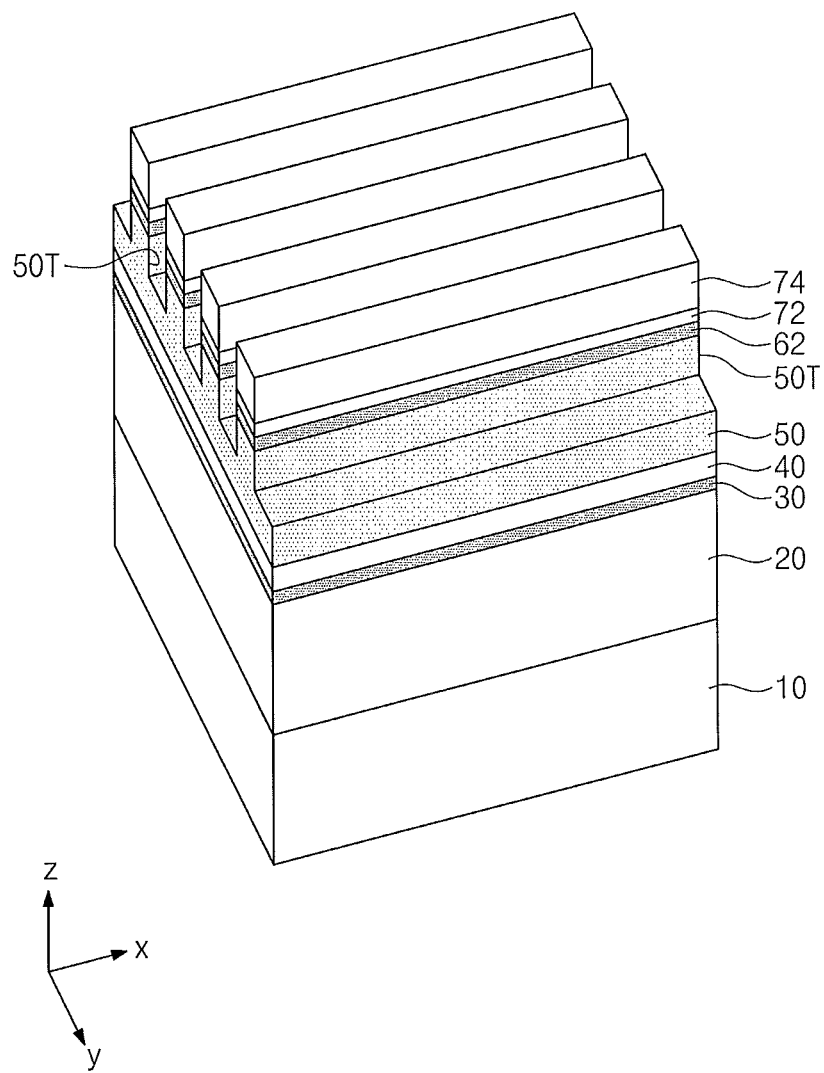

Referring to FIG. 2, trenches 50T may be formed in the first organic mask layer 50 by using the first line mask patterns 62 as etch masks. Portions of the first organic mask layer 50 may be etched using the first line mask patterns 62 as the etch masks to form the trenches 50T. The etching process for the formation of the trenches 50T may be an anisotropic etching process such as an etch-back process.

In some embodiments, the first organic mask layer 50 may be dry-etched under a plasma atmosphere including plasma generated from an etching gas. For example, the dry plasma etching process for the first organic mask layer 50 may be performed using an inductively coupled plasma (ICP) type etching apparatus or a dual frequency capacitively coupled plasma (CCP) type etching apparatus. At this time, a fluorine-based etching gas may be used to etch the first organic mask layer 50. In more detail, the process of anisotropically etching the first organic mask layer 50 may use a mixture gas of the fluorine-based etching gas and an oxygen (O2) gas or a mixture gas of the fluorine-based etching gas, an oxygen (O2) gas, and an argon (Ar) gas. Here, C3F6, C4F6, C4F8, or C5F8 may be used as the fluorine-based etching gas. The oxygen (O2) gas supplied along with the fluorine-based etching gas may remove a polymer byproduct generated during the etching process. The argon (Ar) gas may be used as a carrier gas and may generate an impact of ions.

According to some embodiments, the first photoresist patterns 74 and the first anti-reflective patterns 72 disposed on the first line mask patterns 62 may be removed during the formation of the trenches 50T in the first organic mask layer 50. Alternatively, before the trenches 50T are formed in the first organic mask layer 50, the first photoresist patterns 74 and the first anti-reflective patterns 72 may be removed by an ashing process and/or a stripping process.

Figure 3:
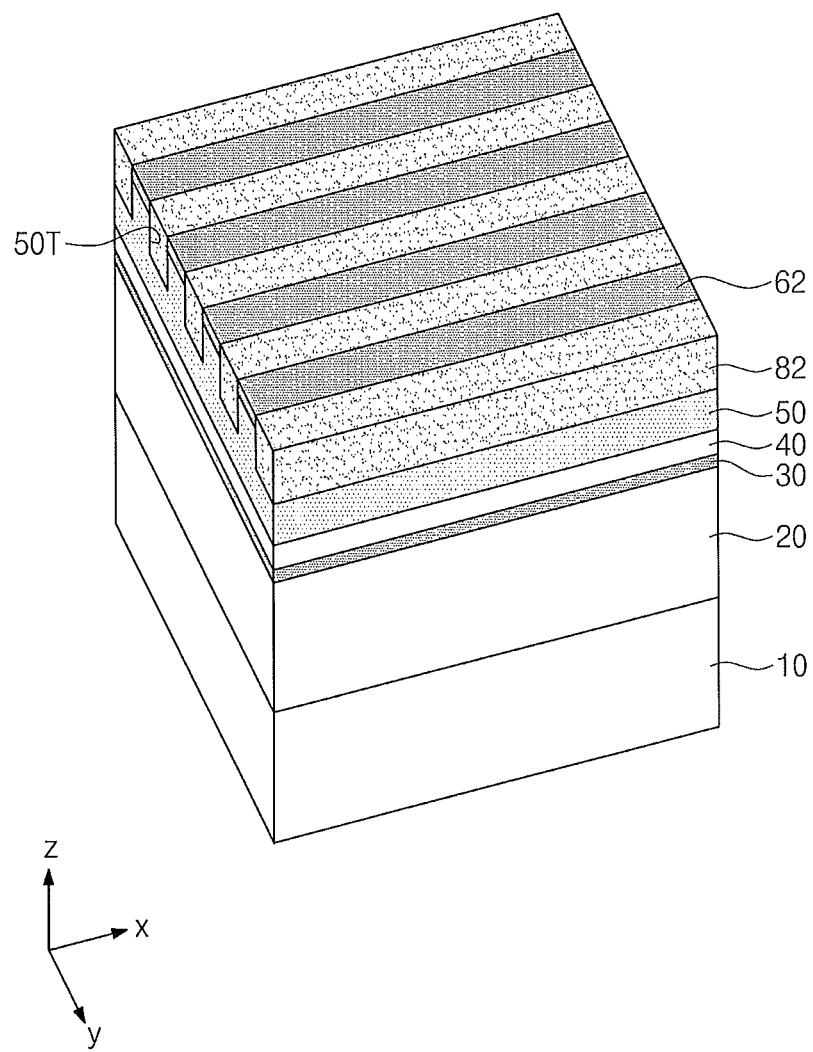

Referring to FIG. 3, a second organic mask layer 82 may be formed to fill each of the trenches 50T formed in the first organic mask layer 50. In some embodiments, the second organic mask layers 82 respectively formed in the trenches 50T may have line shapes and may be parallel to each other. The second organic mask layer 82 may be disposed between the first line mask patterns 62 in a plan view. In some embodiments, both sidewalls of the second organic mask layer 82 may be in direct contact with inner sidewalls of the trenches 50T. In other words, a width of the second organic mask layer 82 may be substantially equal to a width of the trenches 50T. A top surface of the second organic mask layer 82 may be disposed at substantially the same level as top surfaces of the first line mask patterns 62. Thus, after the second organic mask layers 82 are formed, a height of a mask structure formed on the hard mask layer 40 may be substantially uniform.

In detail, a second organic mask layer may be coated to cover the first line mask patterns 62 by a spin-on-coating process and then an anisotropic etching process may be performed on the coated second organic mask layer until the first line mask patterns 62 are exposed, thereby the second organic mask layers 82 illustrated in FIG. 3 are formed. In the spin-on-coating process, the coated second organic mask layer may be thicker than a depth of the trench 50T formed in the first organic mask layer 50. For example, the coated second organic mask layer disposed on the top surface of the first line mask pattern 62 may have a thickness of about 800 Å to about 1000 Å. Since the second organic mask layer is formed by the spin-on-coating process, the coated second organic mask layer may have a flat top surface regardless of a profile of the first organic mask layer 50 having the trenches 50T. Additionally, after the spin-on-coating process, a bake process may be performed on the coated second organic mask layer. Additionally, when the coated second organic mask layer is anisotropically etched after the spin-on-coating process, a ratio of an etch rate of the coated second organic mask layer to an etch rate of the first line mask patterns 62 may be 10:1 or more. In other words, when the coated second organic mask layer is anisotropically etched, the first line mask patterns 62 may be used as an etch stop layer.

In some embodiments, the second organic mask layer 82 may be formed of a material having an etch selectivity with respect to the hard mask layer 40 and the first line mask patterns 62 in a process of etching the hard mask layer 40 and the first line mask patterns 62. In detail, the second organic mask layer 82 may be formed of a material including carbon as its main ingredient. In some embodiments, the second organic mask layer 82 may have a carbon content of about 80 wt % to about 99 wt % with respect to the total weight of a material constituting the second organic mask layer 82. In some embodiments, the second organic mask layer 82 may be formed of a spin-on-hardmask (SOH) material. The SOH material may include a carbon-based SOH material or a silicon-based SOH material. In another embodiment, the second organic mask layer 82 may be formed of photoresist or amorphous silicon.

Figure 4:
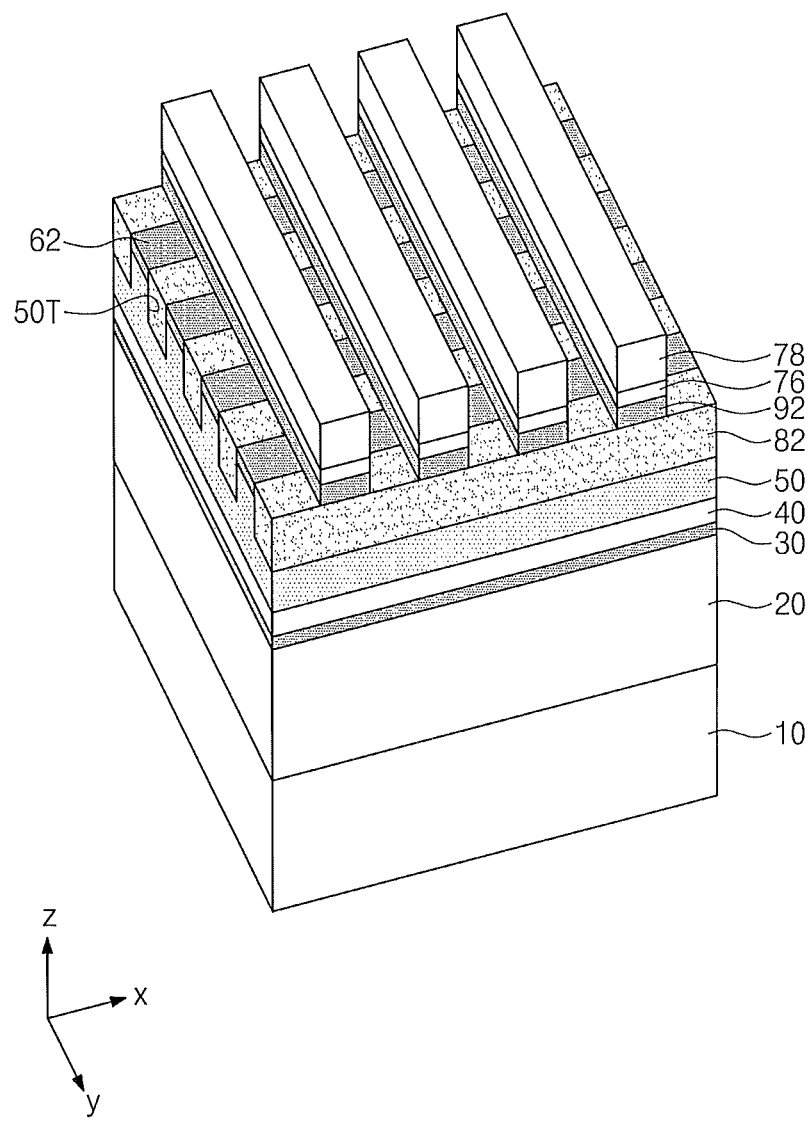

Referring to FIGS. 4 and 17, second line mask patterns 92 may be formed on the first line mask patterns 62.

The second line mask patterns 92 may extend in a second direction, for example a y-axis direction in FIG. 4, and may cross over the first line mask patterns 62 and the second organic mask layers 82. The second line mask patterns 92 may be in direct contact with portions of the first line mask patterns 62 and portions of the second organic mask layers 82.

Referring to FIG. 17, the first and second line mask patterns 62 and 92 may have a lattice-shape when viewed from a plan view. In other words, first regions R1 and second regions R2 may be defined by the first and second line mask patterns 62 and 92 in a plan view. The first regions R1 may be exposed by the first and second line mask patterns 62 and 92, and the second regions R2 may correspond to overlapping regions of the first and second line mask patterns 62 and 92. After the second line mask patterns 92 are formed, the top surfaces of the second organic mask layers 82 may be locally exposed in the first regions R1. On the other hand, the first and second line mask patterns 62 and 92 may be stacked on the first organic mask layer 50 in each of the second regions R2.

In some embodiments, as illustrated in FIG. 17, a pitch of the second line mask patterns 92 may be substantially equal to the pitch of the first line mask patterns 62. Additionally, a width W2 of the second line mask pattern 92 may be substantially equal to the width W1 of the first line mask pattern 62. In another embodiment, a pitch of the second line mask patterns 92 may be greater than the pitch of the first line mask patterns 62, as illustrated in FIG. 20. In other words, a width W2 of the second line mask pattern 92 may be greater than the width W1 of the first line mask pattern 62. A space S2 between second line mask patterns 92 may be substantially equal to the width W2 of the second line mask pattern 92, as illustrated in FIGS. 17 and 20.

In some embodiments, the second line mask patterns 92 may be formed to be thicker than the first line mask patterns 62. Alternatively, a thickness of the second line mask patterns 92 may be substantially equal to a thickness of the first line mask patterns 62. For example, the second line mask patterns 92 may have the thickness of about 200 Å to about 400 Å.

In some embodiments, the second line mask patterns 92 may be formed of a material having an etch selectivity with respect to the first and second organic mask layers 50 and 82. In some embodiments, the second line mask patterns 92 may be formed of the same material as the first line mask patterns 62. For example, the second line mask patterns 92 may be formed of silicon oxynitride (SiON), silicon oxide (SiO2), silicon nitride (Si3N4), and silicon-carbon nitride (SiCN), silicon carbide (SiC), or poly-silicon.

Forming the second line mask patterns 92 may include forming a second mask layer covering the first line mask patterns 62 and the second organic mask layers 82, forming second photoresist patterns 78 crossing over the first line mask patterns 62 on the second mask layer, and anisotropically etching the second mask layer using the second photoresist patterns 78 as etch masks until the second organic mask layers 82 are exposed. In some embodiments, second anti-reflective patterns 76 may be formed between the second mask layer and the second photoresist patterns 78.

In some embodiments, the second photoresist patterns 78 may have line shapes crossing over the first line mask patterns 62. A pitch of the second photoresist patterns 78 may be substantially equal to the pitch of the first photoresist patterns 74. A resist material may be coated on the second mask layer to form a second photoresist layer and then an exposure process and a development process may be sequentially performed on the second photoresist layer to form the second photoresist patterns 78.

The second anti-reflective patterns 76 may be formed of a material having an etch selectivity with respect to the second mask layer and may absorb light to reduce reflection of the light during the exposure process. The second anti-reflective patterns 76 may be formed of an organic compound or an inorganic compound. In some embodiments, the second anti-reflective patterns 76 may be formed of an organic material having an etching property similar to that of photoresist.

In some embodiments, the second photoresist patterns 78 and the second anti-reflective patterns 76 may be removed after the second line mask patterns 92 are formed. Alternatively, the second photoresist patterns 78 and the second anti-reflective patterns 76 may be removed during a subsequent etching process that is performed on the second organic mask layer 82.

The first and second organic mask layers 50 and 82 are etched using the first and second line mask patterns 62 and 92 as etch masks. According to some embodiments, the first and second organic mask layers 50 and 82 may be etched by an anisotropic etching process such as an etch-back process. At this time, a fluorine-based etching gas may be used to etch the first and second organic mask layers 50 and 82 including carbon as their main ingredients. In detail, the anisotropic etching process of the first and second organic mask layers 50 and 82 may use a mixture gas of the fluorine-based etching gas and an oxygen (O2) gas or a mixture gas of the fluorine-based etching gas, an oxygen (O2) gas, and an argon (Ar) gas. C3F6, C4F6, C4F8, or C5F8 may be used as the fluorine-based etching gas. The oxygen (O2) gas supplied along with the fluorine-based etching gas may remove a polymer byproduct generated during the etching process. The argon (Ar) gas may be used as a carrier gas and may generate an impact of ions.

A ratio of an etch rate of the first and second organic mask layers 50 and 82 to an etch rate of the first and second line mask patterns 62 and 92 may be 10:1 or more in the etching process of the first and second organic mask layers 50 and 82. Thus, the first and second line mask patterns 62 and 92 may remain on the first and second organic mask layers 50 and 82 until a top surface of the hard mask layer 40 is exposed.

Figure 5:
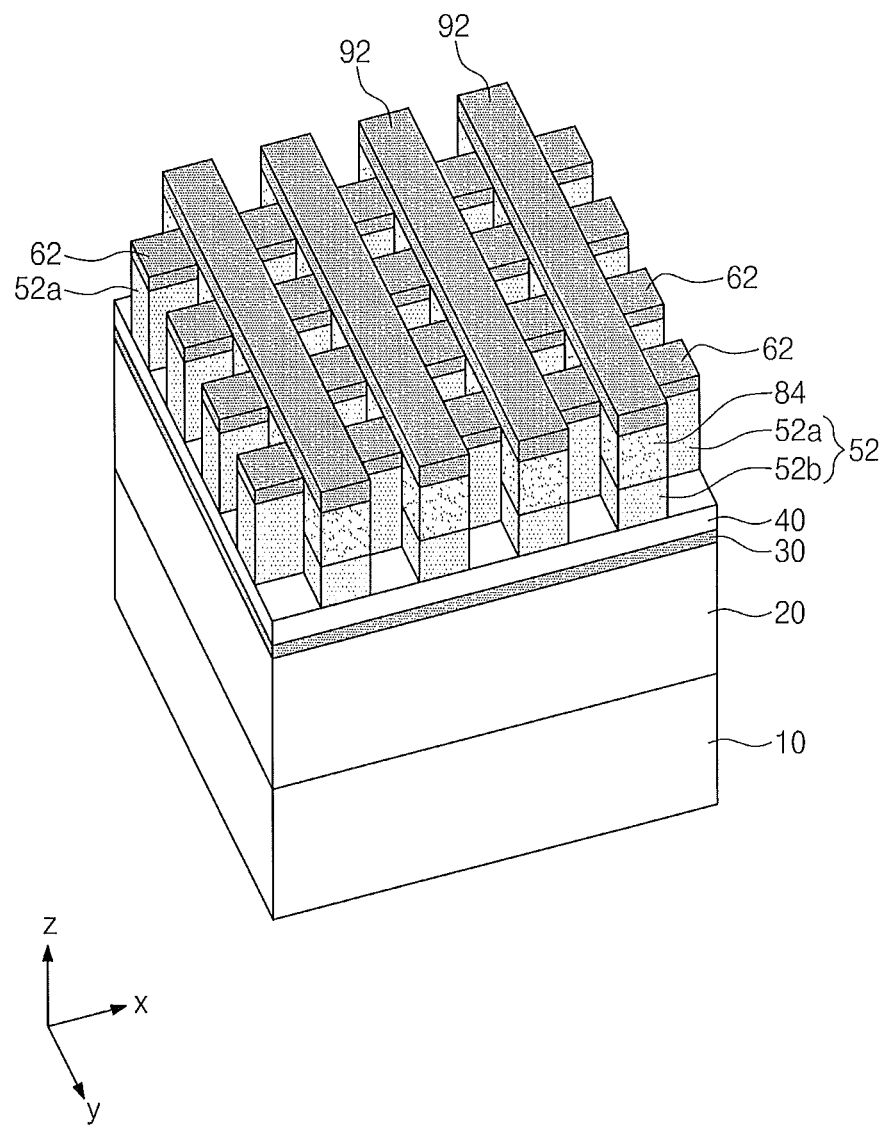

Since the first and second organic mask layers 50 and 82 are anisotropically etched using the first and second line mask patterns 62 and 82 as etch masks, second organic mask patterns 84 and a first organic mask pattern 52 may be formed as illustrated in FIG. 5. The first organic mask pattern 52 has openings.

The second organic mask patterns 84 may be formed on the first organic mask pattern 52. Each of the second organic mask patterns 84 may have first sidewalls exposed by the openings and second sidewalls contacting the first organic mask pattern 52. In the first direction (i.e., the x-axis direction), a space between the second organic mask patterns 84 may be substantially equal to the space between the second line mask patterns 92. In the second direction (i.e., the y-axis direction), a space between the second organic mask patterns 84 may be substantially equal to the space between the first line mask patterns 62.

The openings of the first organic mask pattern 52 may be formed in the first regions exposed by the first and second line mask patterns 62 and 92. The openings may expose the top surface of the hard mask layer 40. In more detail, the first organic mask pattern 52 may include first portions 52a having line shapes extending in the first direction (i.e., the x-axis direction) and second portions 52b spaced apart from each other between the first portions 52a. A height of each of the first portions 52a may be different from a height of each of the second portions 52b. In other words, top surfaces of the first portion 52a of the first organic mask pattern 52 may be higher than top surfaces of the second portion 52b of the first organic mask pattern 52. That is, the first organic mask pattern 52 may have a height difference between the first portion 52a and the second portion 52b. The first organic mask pattern 52 may have a lattice-shape in a plan view.

The second organic mask patterns 84 may be disposed on the second portions 52b of the first organic mask pattern 52, respectively. Here, a height of each of the second organic mask patterns 84 may be greater than the height difference between the first and second portions 52a and 52b of the first organic mask pattern 52. Thus, top surfaces of the second organic mask patterns 84 may be higher than the top surfaces of the first portions 52a of the first organic mask pattern 52. In some embodiments, the top surfaces of the second organic mask patterns 84 may be substantially coplanar with the top surfaces of the first line mask patterns 62.

In some embodiments, the first and second organic mask patterns 52 and 84 formed using the first and second line mask patterns 62 and 92 as etch masks may be used as etch masks in a subsequent process for forming first holes in the hard mask layer 50.

Figure 6:
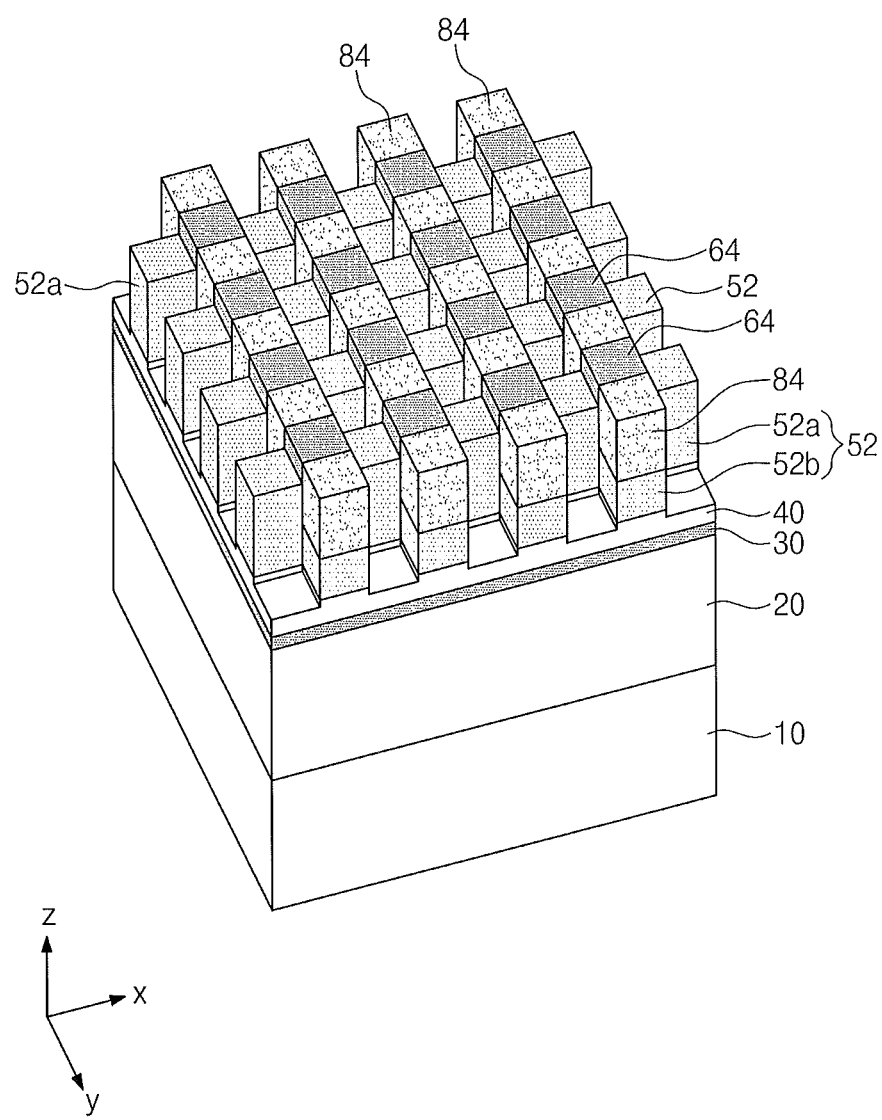

Referring to FIG. 6, a blanket anisotropic etching process may be performed on the first and second line mask patterns 62 and 92 to form local mask patterns 64 in the second regions corresponding to regions overlapped by the first and second line mask patterns 62 and 92

In more detail, a blanket etch-back process may be performed on the first and second line mask patterns 62 and 92. The blanket etch-back process may be performed until the first organic mask pattern 52 is exposed. At this time, the local mask patterns 64 may be formed by a difference between a thickness of the mask patterns in the overlapping region and a thickness of the mask patterns in a non-overlapping region of the first and second line mask patterns 62 and 92. Each of the local mask patterns 64 may be formed on the first organic mask pattern 52 between the second organic mask patterns 84.

In some embodiments, if the first and second line mask patterns 62 and 92 are formed of the same material and have substantially the same thickness, the second line mask patterns 92 may be completely removed and the local mask patterns 64 may be formed of portions of the first line mask patterns 62 on the first organic mask pattern 52 between the second organic mask patterns 84.

In some embodiments, if the first and second line mask patterns 62 and 92 are formed of the same material and each of the second line mask patterns 92 may be thicker than each of the first line mask pattern 62, the local mask patterns 64 may be formed of portions of the first and second line mask patterns 62 and 92 on the first organic mask pattern 52 between the second organic mask patterns 84.

When the blanket etch-back process is performed on the first and second line mask patterns 62 and 92, the hard mask layer 40 exposed by the openings of the first organic mask pattern 52 may be partially etched.

In some embodiments, the local mask patterns 64 may be formed after a hard mask layer 42 having first holes 41 is formed. In other words, the first holes 41 may be formed in the hard mask layer 42 by using the first and second line mask patterns 62 and 92 as etch masks.

Figure 7:
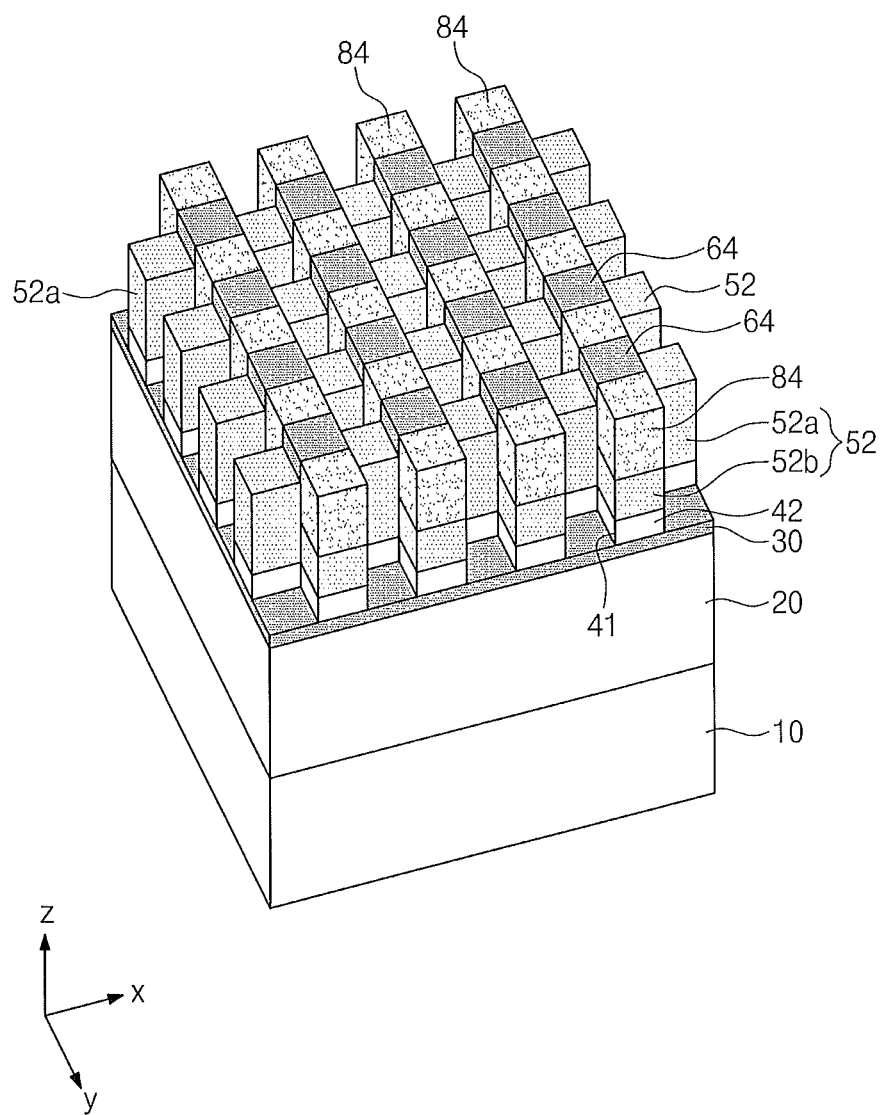

Referring to FIGS. 7 and 18, the hard mask layer 40 of FIG. 6 may be anisotropically etched using the first and second organic mask patterns 52 and 84 as etch masks, thereby the hard mask layer 42 having the first holes 41 of FIGS. 7 and 18 is formed. That is, the first holes 41 may penetrate the hard mask layer 42. At this time, the first portions 52a of the first organic mask pattern 52 may be used as first line mask patterns extending in the first direction, and the second portions 52b of the first organic mask pattern 52 and the second organic mask patterns 84 may be used as second line mask patterns extending in the second direction.

During the anisotropic etching process for the hard mask layer 42, since the local mask patterns 64 have an etch selectivity with respect to the hard mask layer 42, the local mask patterns 64 may remain on the first organic mask pattern 52 until a top surface of the etch stop layer 30 is exposed. In some embodiments, thicknesses of the local mask patterns 64 may be reduced during the anisotropic etching process for the hard mask layer 42.

According to some embodiments of the present inventive concept, the first holes 41 may be formed in the first regions exposed by the first and second line mask patterns 62 and 92, as illustrated in FIG. 18. The first holes 41 may be formed to be arranged at equal spaces corresponding to the pitch of the first line mask patterns 62 in the first direction (i.e., the x-axis direction). The first holes 41 may be arranged at equal spaces corresponding to the pitch of the second line mask patterns 92 in the second direction (i.e., the y-axis direction). In some embodiments, the space between the first holes 41 in the first direction may be substantially equal to the space between the first holes 41 in the second direction, as illustrated in FIG. 18. In some embodiments, the space between the first holes 41 in the first direction may be greater than the space between the first holes 41 in the second direction, as illustrated in FIG. 20. In some embodiments, the space between the first holes 41 in the first direction may be less than the space between the first holes 41 in the second direction.

Figure 8:
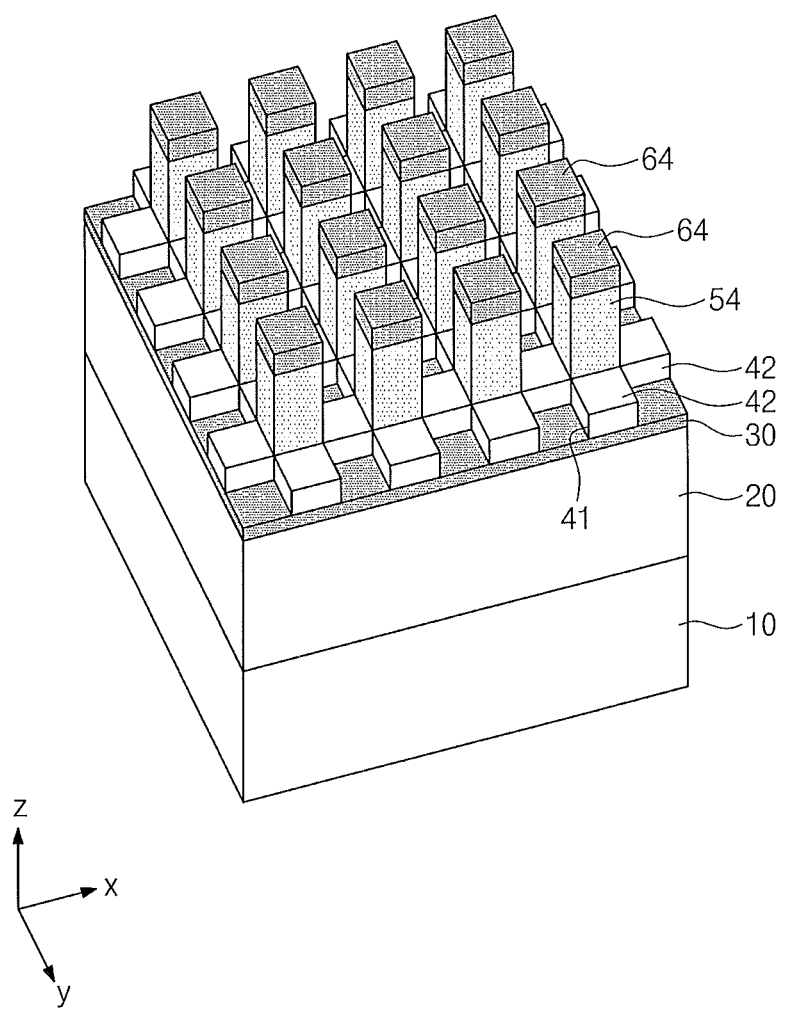

Referring to FIG. 8, the first and second organic mask patterns 52 and the 84 are anisotropically etched using the local mask patterns 64 as etch masks. The anisotropic etching process of the first and second organic mask patterns 52 and 84 may be performed until a top surface of the hard mask layer 42 having the first holes 41 is exposed. At this time, the first and second organic mask patterns 52 and 84 including carbon as their main ingredients may be etched using a fluorine-based etching gas.

The second organic mask patterns 84 may be completely removed by the anisotropic etching process. Additionally, the first organic mask pattern 52 exposed by the local mask patterns 64 may be etched by the anisotropic etching process. Thus, local organic mask patterns 54 may be formed under the local mask patterns 64, respectively. The local organic mask patterns 54 may be portions of the first organic mask pattern that remain under the local mask patterns 64, respectively. In other words, the local organic mask patterns 54 may be formed in the second regions R2 overlapped by the first and second line mask patterns 62 and 92 in FIG. 17.

When the first and second organic mask patterns 52 and 84 are anisotropically etched, the lower layer 20 under the first holes 41 of the hard mask layer 42 may not be exposed because the etch stop layer 30 has an etch selectivity with respect to the first and second organic mask patterns 52 and 84.

After the hard mask layer 42 having the first holes 41, the local mask patterns 64, and the local organic mask patterns 54 are formed, a height of structures on the top surface of the lower layer 20 may be the highest in the second regions but may be the lowest in the first regions.

Figure 9:
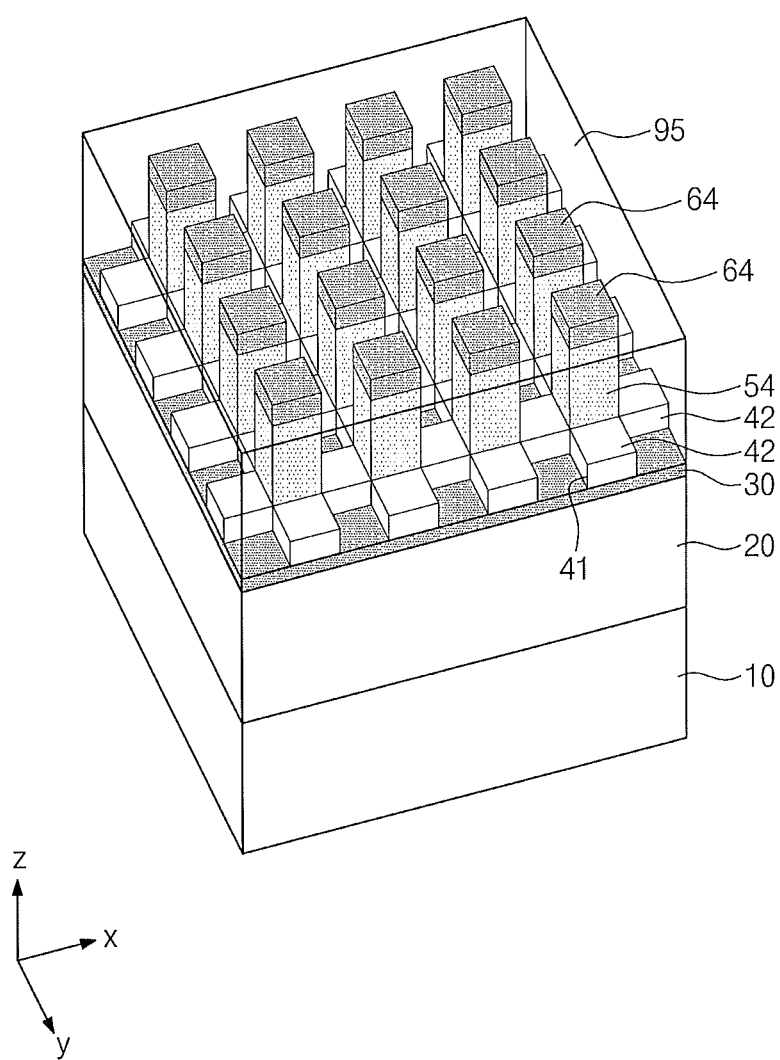

Referring to FIG. 9, a sacrificial layer 95 is formed to fill the first holes 41 of the hard mask layer 42 and an empty region between the local organic mask patterns 54. A sacrificial layer may be deposited to cover top surfaces of the local mask patterns 64 by a deposition method or a spin-on-coating method and then a planarization process may be performed on the deposited sacrificial layer until top surfaces of the local mask patterns 64 are exposed, thereby the sacrificial layer 95 illustrated in FIG. 9 is formed. In some embodiments, a thickness of the sacrificial layer 95 may be greater than a sum of a thickness of the local mask pattern 64 and a thickness of the hard mask layer 42.

In some embodiments, a top surface of the sacrificial layer 95 may be coplanar with the top surfaces of the local mask patterns 64. Alternatively, the planarization process for the deposited sacrificial layer may be performed until top surfaces of the local organic mask patterns 54 are exposed. In this case, a top surface of the sacrificial layer 95 may be coplanar with the top surfaces of the local organic mask patterns 54.

According to some embodiments, the sacrificial layer 95 may be formed of a material having an etch selectivity with respect to the local mask patterns 64 and the local organic mask patterns 54. In some embodiments, if the local organic mask patterns 54 are formed of a material layer including carbon as its main ingredient, for example, a SOH layer or an amorphous carbon layer (ACL), the sacrificial layer 95 may include a silicon oxide layer formed by a deposition method performed at a room temperature. For example, the sacrificial layer 95 may include a silicon oxide layer formed by an atomic layer deposition (ALD) process performed at the room temperature. Since the sacrificial layer 95 is formed by the room temperature ALD process, the local organic mask patterns 54 having a high carbon content may not be damaged during the process of forming the sacrificial layer 95.

According to some embodiments of the present inventive concept, the sacrificial layer 95 may be formed of high density plasma (HDP) oxide, tetraethyl orthosilicate (TEOS), plasma enhanced tetraethyl orthosilicate (PE-TEOS), O3-tetraethyl orthosilicate (O3-TEOS), undoped silicate glass (USG), phosphosilicate glass (PSG), borosilicate glass (BSG), borophosphosilicate glass (BPSG), fluoride silicate glass (FSG), spin on glass (SOG), Tonen silazene (TOSZ), or any combination thereof.

Figure 10:
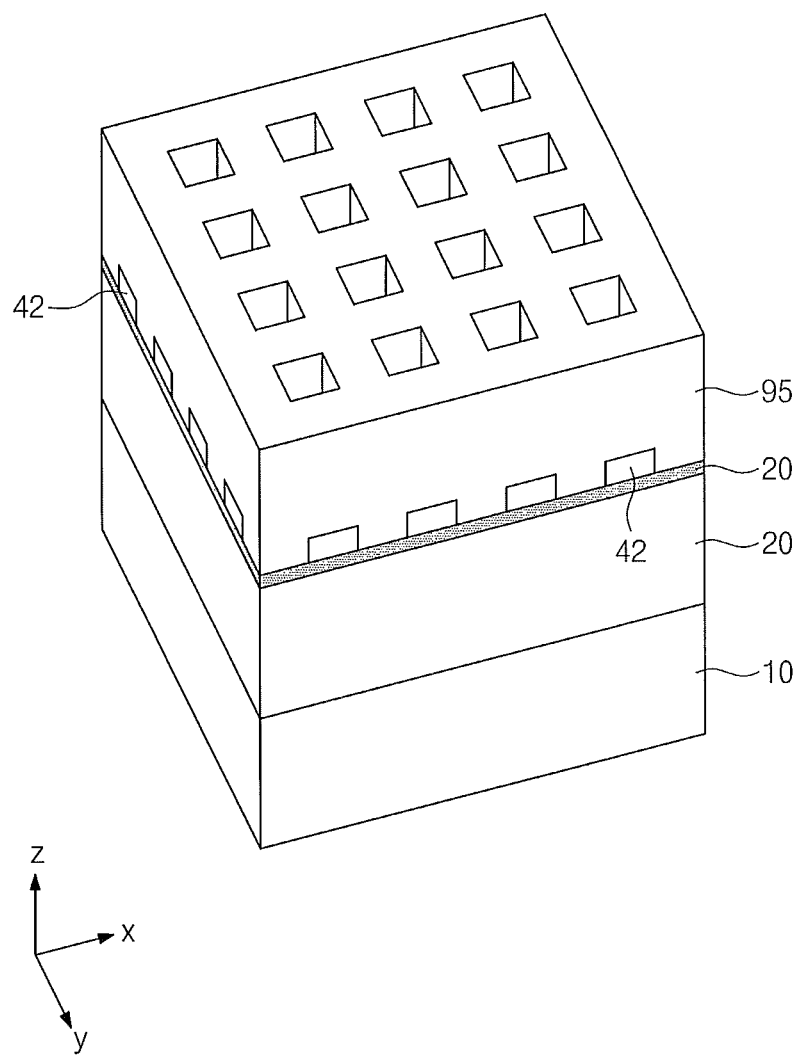

Referring to FIG. 10, the local mask patterns 64 and the local organic mask patterns 54 disposed in the sacrificial layer 95 may be removed. Thus, the sacrificial layer 95 may have openings locally exposing the top surface of the hard mask layer 42 having the first holes 41. The local mask patterns 64 and the local organic mask patterns 54 may be selectively removed by a wet etching process and/or a dry etching process. The openings of the sacrificial layer 95 may be formed at positions corresponding to the second regions R2 described with reference to FIG. 17.

Figure 11:
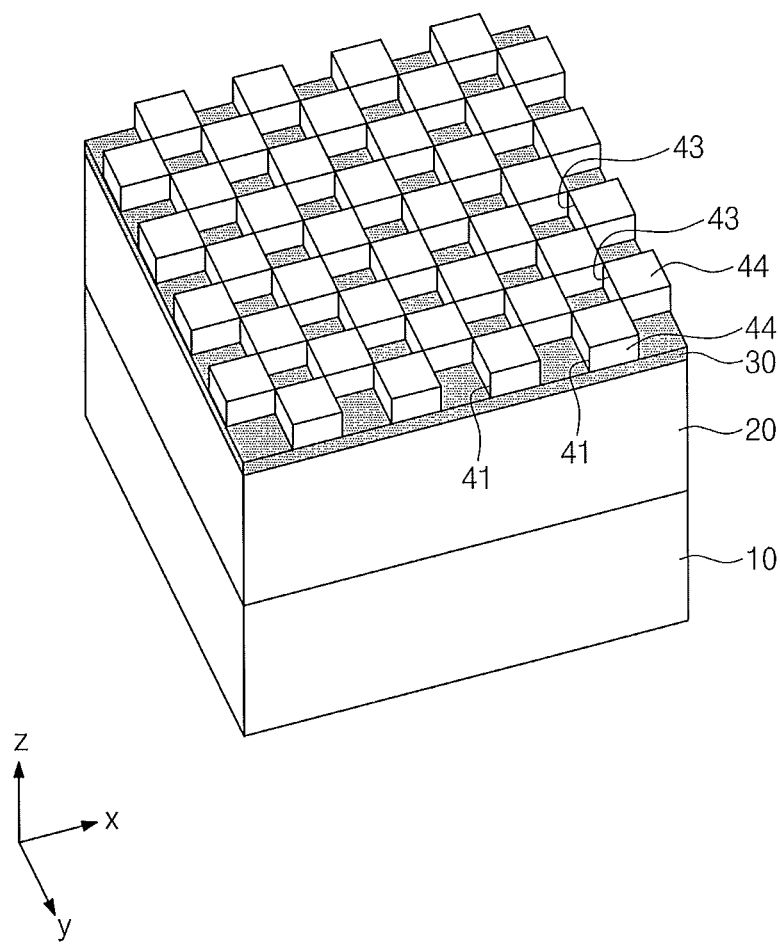

Referring to FIGS. 11 and 19, the hard mask layer 42 exposed by the openings of the sacrificial layer 95 is anisotropically etched to form second holes 43 in the hard mask layer 42.

The second holes 43 may be formed in a diagonal direction from the first holes 41 already formed in the hard mask layer 42. In FIG. 11, a reference numeral '44' indicates a hard mask pattern 44 having the first holes 41 and the second holes 43. The first and second holes 41 and 43 of the hard mask pattern 42 may be arranged in a zigzag pattern when viewed from a plan view.

In more detail, the second holes 43 may be respectively formed in the second regions R2 where the first and second line mask patterns 62 and 92 of FIG. 17 overlap with each other. The second holes 43 may be formed to be arranged at equal spaces corresponding to the pitch of the first line mask patterns 62 in the first direction (i.e., the x-axis direction). The second holes 43 may be arranged at equal spaces corresponding to the pitch of the second line mask patterns 92 in the second direction (i.e., the y-axis direction). In some embodiments, a distance between one first hole 41 and one second hole 43 adjacent to each other may be substantially equal to a distance between another first hole 41 and another second hole 43 adjacent to each other.

In some embodiments, the space between the second holes 43 in the first direction may be substantially equal to the space between the second holes 43 in the second direction, as illustrated in FIG. 19. In some embodiments, the space between the second holes 43 in the first direction may be greater than the space between the second holes 43 in the second direction, as illustrated in FIG. 20. In some embodiments, the space between the second holes 43 in the first direction may be less than the space between the second holes 43 in the second direction.

After the second holes 43 are formed, the sacrificial layer 95 on the hard mask pattern 44 may be removed. The sacrificial layer 95 may be removed using an etch recipe having an etch selectivity with respect to the hard mask pattern 44 and the etch stop layer 30. For example, the sacrificial layer 95 may be removed using a wet etching process, and the etch stop layer 30 may cover the lower layer 20 during the wet etching process. In some embodiments, if the sacrificial layer 95 is formed of a silicon oxide layer, the wet etching process for the removal of the sacrificial layer 95 may be performed using a limulus amoebocyte lysate (LAL) solution.

Figure 12:
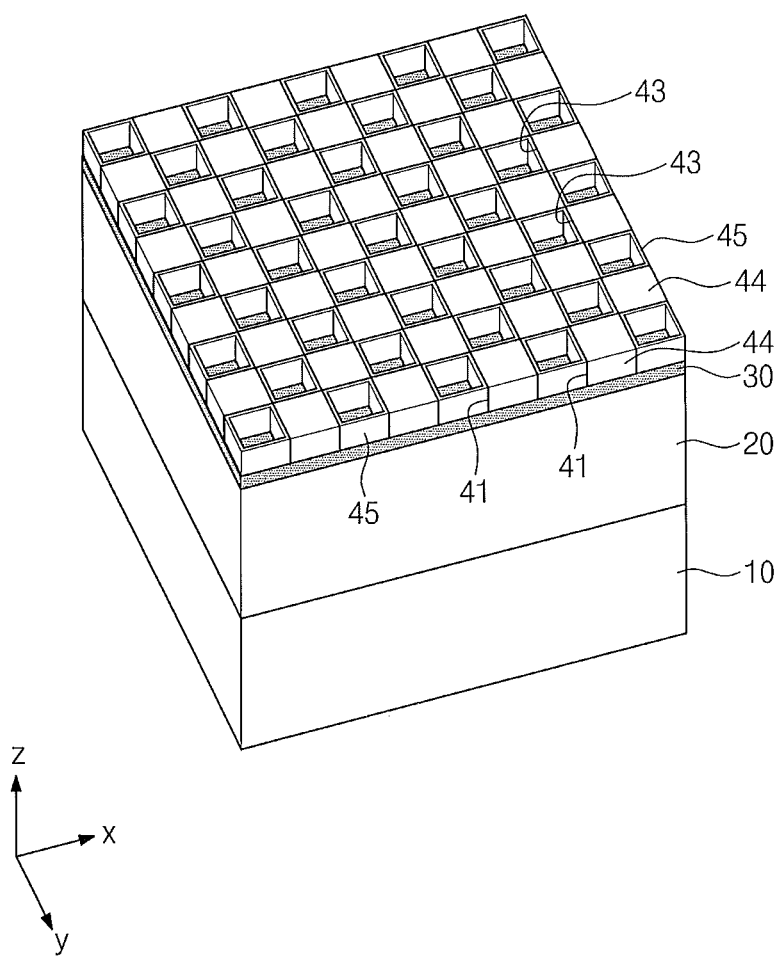

Referring to FIG. 12, a spacer 45 may be formed on an inner sidewall of each of the first and second holes 41 and 43 of the hard mask pattern 44. In more detail, a spacer layer may be formed to conformally cover the inner sidewalls of the first and second holes 41 and 43, and then an etch-back process may be performed on the spacer layer until the top surface of the etch stop layer 30 is exposed. Thus, the spacers 45 may be formed on the inner sidewalls of the first and second holes 41 and 43, respectively. The spacer layer may be formed by a deposition method, such as a chemical vapor deposition (CVD) process or an atomic layer deposition (ALD) process. The spacer layer may be deposited to have a thickness less than a half of the width of each of the first and second holes 41 and 43. Additionally, the spacer 45 may be formed of a material having an etch selectivity with respect to the lower layer 20, the etch stop layer 30, and the hard mask pattern 44. For example, the spacer 45 may be formed of a silicon oxynitride (SiON), silicon oxide (SiO2), silicon nitride (Si3N4), silicon-carbon nitride (SiCN), silicon carbide (SiC), and poly-silicon. In some embodiments, the forming process of the spacer 45 may be omitted.

Figure 13:
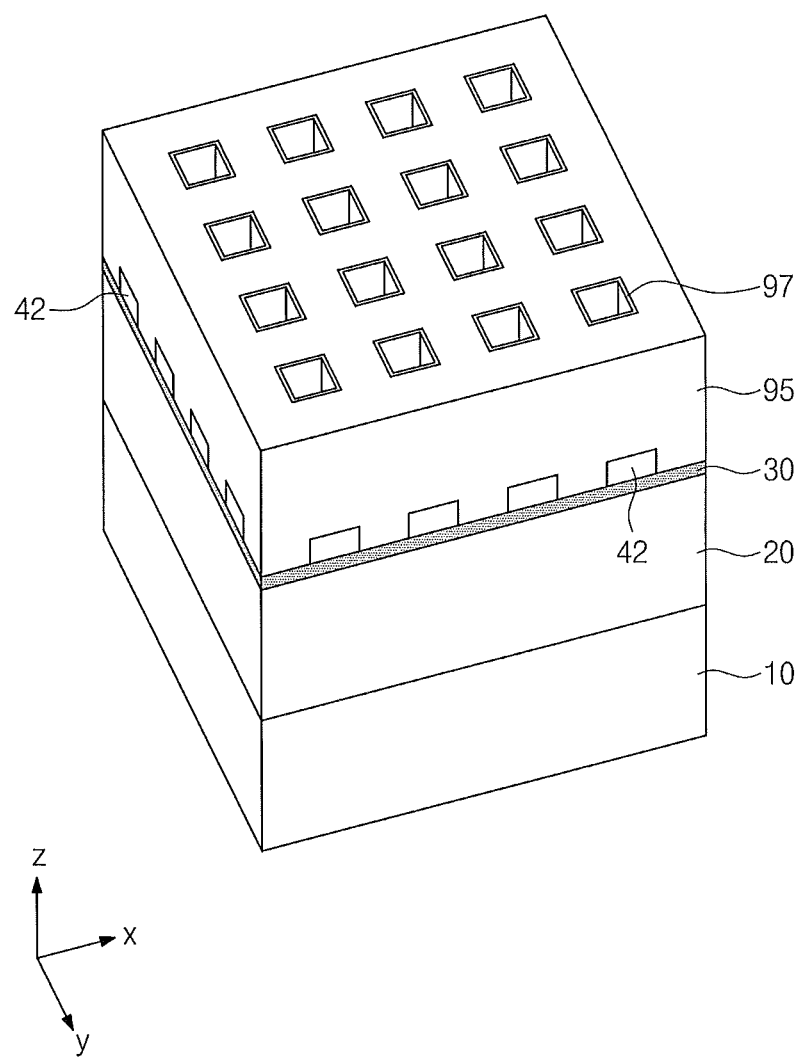
Figure 14:
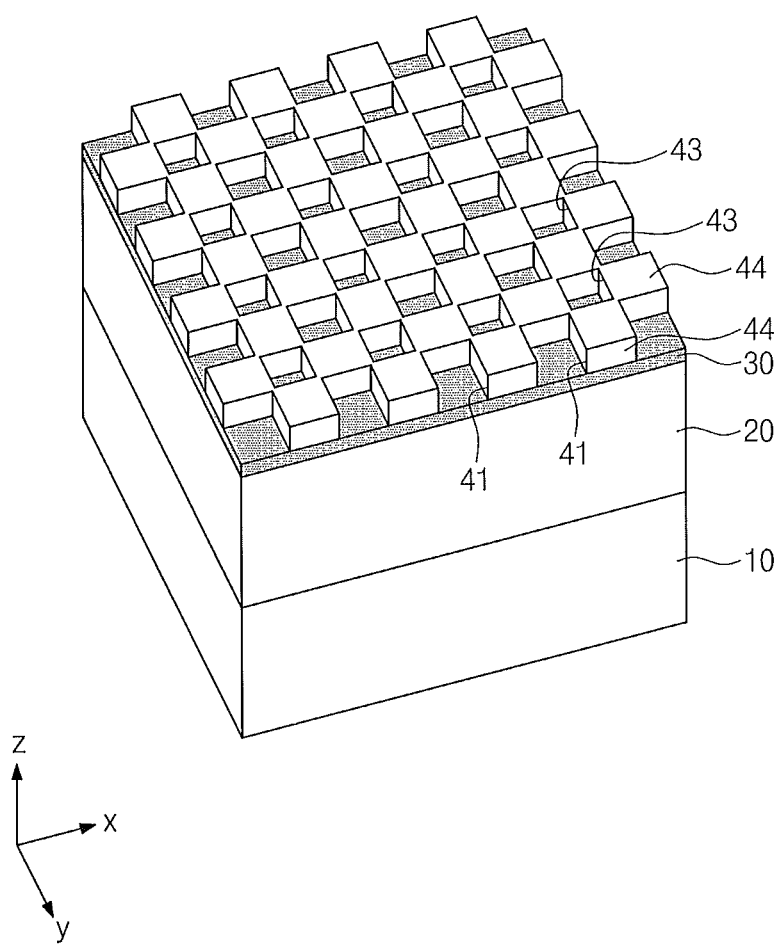

Meanwhile, according to some embodiments illustrated in FIGS. 13 and 14, the sacrificial layer 95 having the openings of FIG. 10 may be formed and then spacers 97 may be formed on inner sidewalls of the openings, respectively.

In more detail, the openings may be formed in the sacrificial layer 95 and then a spacer layer may be formed to conformally cover the inner sidewalls of the openings. Here, the spacer layer may be formed of a material having an etch selectivity with respect to the hard mask layer 42 and the sacrificial layer 95. For example, the spacer layer may be formed of silicon oxynitride (SiON), silicon oxide (SiO2), silicon nitride (Si3N4), silicon-carbon nitride (SiCN), silicon carbide (SiC), and poly-silicon. The spacer layer may be formed by a deposition method such as a CVD technique or an ALD technique. The spacer layer may be deposited to have a thickness less than a half of the width of each of the openings in the sacrificial layer 95. Subsequently, the spacer layer may be anisotropically etched until the top surface of the sacrificial layer 95 is exposed and thereby the spacers 97 on the inner sidewalls of the openings of the sacrificial layer 95 are formed. Since the spacers 97 are formed, the first holes 41 may not be exposed by the openings of the sacrificial layer 95.

The hard mask layer 42 exposed by the openings having the spacers 97 may be anisotropically etched to form a hard mask pattern 44 having second holes 43, as illustrated in FIG. 14. Due to the spacers 97, the hard mask layer may remain between the second hole 43 and the first hole 41. Additionally, a diameter of each the second holes 43 may be less than a diameter of each of the first holes 41.

Figure 15:
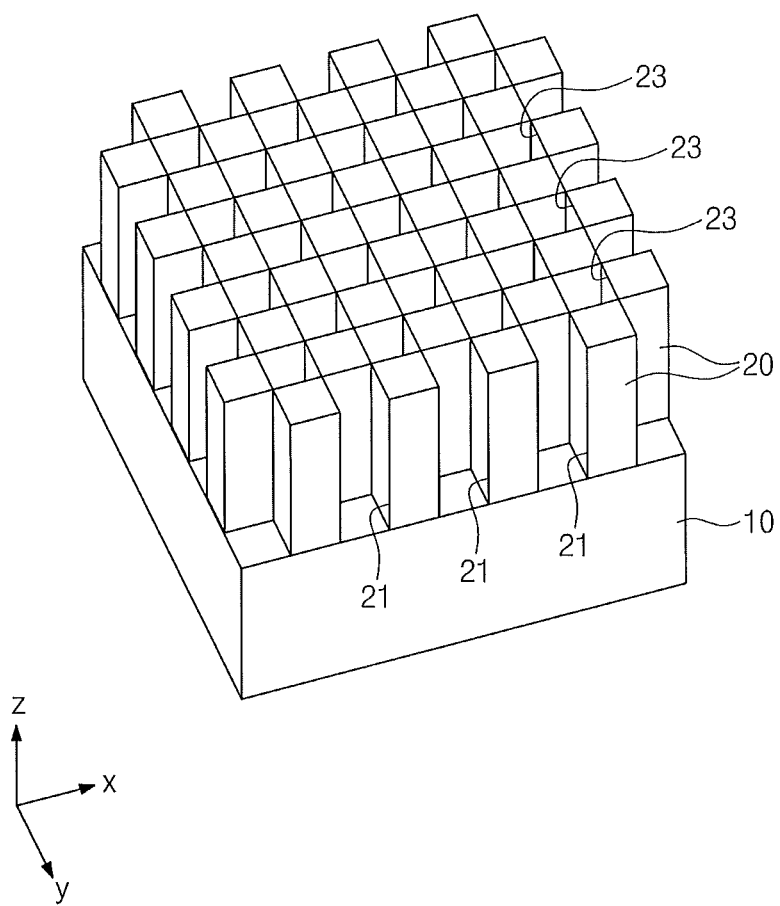

The hard mask pattern 44 having the first and second holes 41 and 43 may be used as an etch mask. Referring to FIG. 15, the etch stop layer 30 and the lower layer 20 are anisotropically etched using the hard mask pattern 44 having the first and second holes 41 and 43 as an etch mask. In other words, the first and second holes 41 and 43 of the hard mask pattern 44 may be transferred to the lower layer 20, such that lower holes 21 and 23 may be formed in the lower layer 20. The lower holes 21 and 23 may be arranged in zigzag pattern. The lower holes 21 and 23 in the lower layer 20 may expose the substrate 10.

Like the first and second holes 41 and 43, the lower holes 21 and 23 may include first lower holes 21 and second lower holes 23. The first lower holes 21 may be arranged at equal spaces in the first and second directions and second holes 23, and the second lower holes 23 may be disposed in the diagonal direction from the second lower holes 21, respectively. In other words, the first lower holes 21 and the second lower holes 23 may be arranged in zigzag pattern when viewed from a plan view. Additionally, a distance between centers of one of the first lower hole 21 and one of the second lower hole 23 adjacent to the one of the first lower hole 21 may be substantially equal to a distance between centers of another one of the first lower hole 21 and another one of the second lower hole 23 adjacent to the another one of the first lower hole 21.

In some embodiments, lower holes 21 and 23 in the lower layer 20 may be formed using the hard mask pattern 44 and spacers 45 disposed in the first and second holes of the hard mask pattern 44 in FIG. 12. In this case, the first lower holes 21 are not connected to the second lower holes 23 when the anisotropic etching process is performed on the lower layer 20. In other words, portions of the lower layer 20 may remain between the first lower holes 21 and the second lower holes 23.

Figure 16:
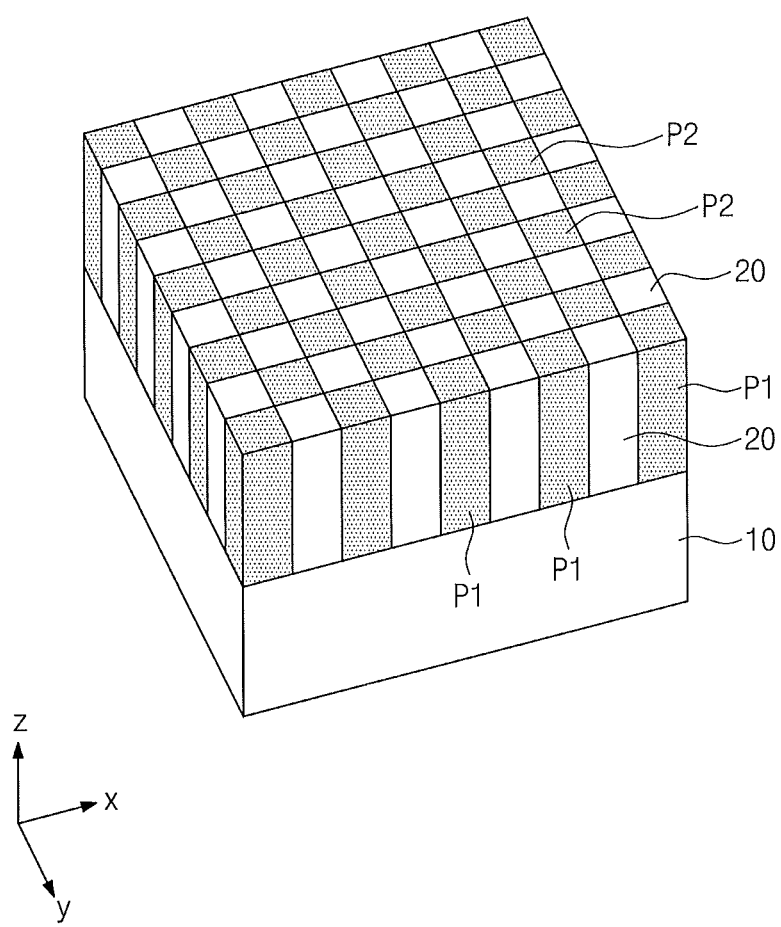

Referring to FIG. 16, fine patterns P1 and P2 are formed in the first and second lower holes of the lower layer 20, respectively. A filling layer may be formed to fill the first and second lower holes 21 and 23 of the lower layer 20 and then a planarization process may be performed on the filling layer to form the fine patterns P1 and P2. The fine patterns P1 and P2 may be formed of a material having an etch selectivity with respect to the lower layer 20. For example, the fine patterns P1 and P2 may be formed of conductive material, semiconductor material, or insulating material. In some embodiments, after the fine patterns P1 and P2 are formed, the lower layer 20 may be removed or may remain.

The fine patterns P1 and P2 may also be arranged in zigzag pattern, for example the arrangement of the first and second holes 41 and 43 illustrated in FIG. 19. The fine patterns P1 and P2 may be classified into first fine patterns P1 formed in the first lower holes 41 and second fine patterns P2 formed in the second lower holes 43.

In more detail, the first and second fine patterns P1 and P2 may be two-dimensionally arranged in the first direction (i.e., the x-axis direction) and the second direction (i.e., the y-axis direction) perpendicular to the first direction when viewed from a plan view. The second fine patterns P2 may be disposed in the diagonal direction from the first fine patterns P1. In a plan view, a distance between centers of one of the first fine patterns P1 and one of the second fine patterns P2 adjacent to the one of the first fine patterns P1 may be substantially equal to a distance between centers of another one of the first fine pattern P1 and another one of the second fine pattern P2 adjacent to the another one of the first fine pattern P1. In some embodiments, a width of each of the first and second fine patterns P1 and P2 in the first direction may be substantially equal to a width of each of the first and second fine patterns P1 and P2 in the second direction.

According to some embodiments illustrated in FIG. 20, a space between the first holes 41 in the second direction may be greater than a space between the first holes 41 in the first direction. Also, a space between the second holes 43 in the second direction may also be greater than a space between the second holes 43 in the first direction. Therefore, the width of each of the first and second fine patterns P1 and P2 in the first direction may be greater the width of each of the first and second fine patterns P1 and P2 in the second direction as illustrated in FIG. 20.

FIGS. 21 to 27 are perspective views illustrating intermediate structures provided in operations of forming a semiconductor device according to some embodiments of the present inventive concepts.

Figure 21:
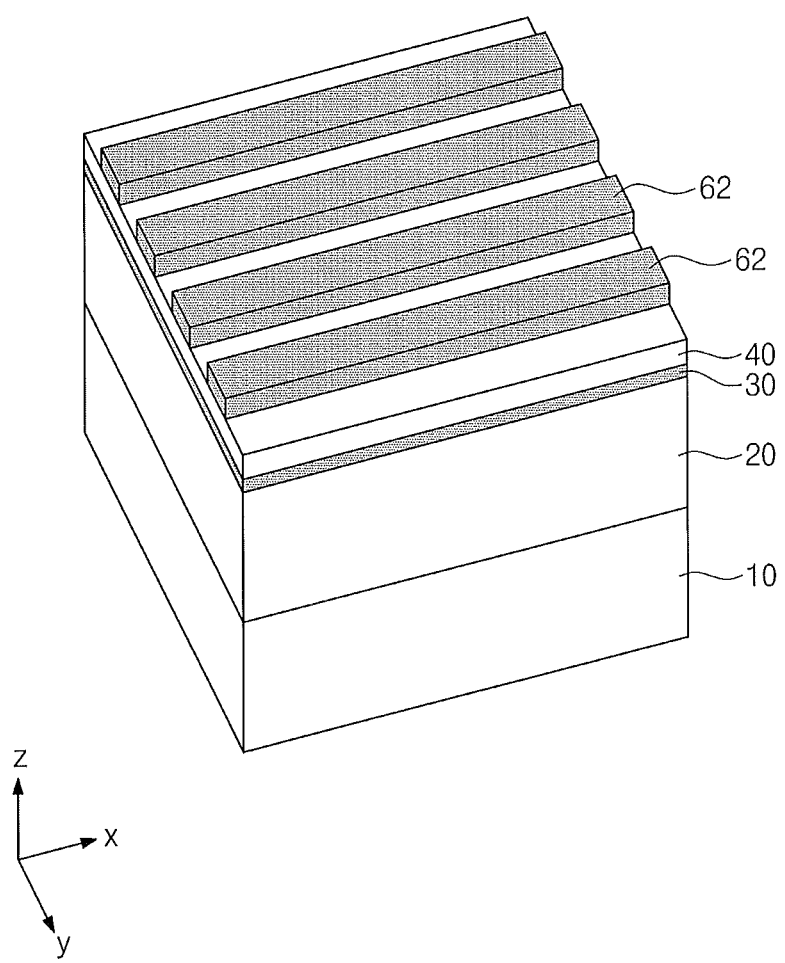
FIGS. 21 to 27 are perspective views illustrating intermediate structures provided in operations of forming a semiconductor device according to some embodiments of the present inventive concepts.

Referring to FIG. 21, a lower layer 20, an etch stop layer 30, and a hard mask layer 40 may be sequentially formed on a substrate 10, as described with reference to FIG. 1. In some embodiments, first line mask patterns 62 may be formed on the hard mask layer 40. A first mask layer may be formed on the hard mask layer 62 and then first photoresist patterns (refer to the reference numeral 72 of FIG. 1) having a line-and-space shape may be formed on the first mask layer. The first mask layer may be anisotropically etched using the first photoresist patterns (refer to the reference numeral 72 of FIG. 1) as etch masks until the hard mask layer 40 is exposed. Thus, the first line mask patterns 62 may be formed.

The first line mask patterns 62 may be arranged at equal spaces and may expose a top surface of the hard mask layer 40. The first line mask patterns 62 may be formed of a material having an etch selectivity with respect to the hard mask layer 40. For example, the first line mask patterns 62 may be formed of silicon oxynitride (SiON), silicon oxide (SiO2), silicon nitride (Si3N4), silicon-carbon nitride (SiCN), silicon carbide (SiC), or poly-silicon.

Referring again to FIG. 17, the first line mask patterns 62 may extend in a first direction (i.e., an x-axis direction) and a width W1 of the first line mask pattern 62 may be substantially equal to a space Si between the first line mask patterns 62.

Figure 22:
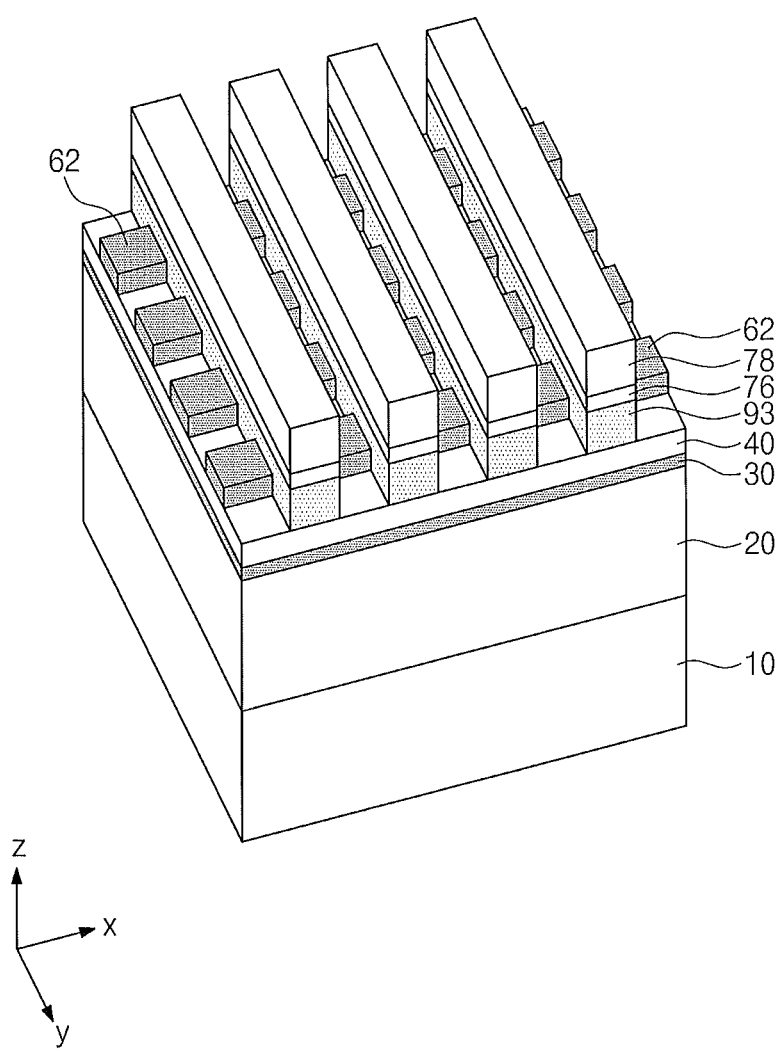

Referring to FIG. 22, second line mask patterns 93 may be formed to cross over the first line mask patterns 62. In some embodiments, a second mask layer may be formed on the first line mask patterns 62 filling gaps between two adjacent ones of the first line mask patterns 62, and then second photoresist patterns 78 may be formed on the second mask layer crossing over the first line mask patterns 62. The second mask layer may be anisotropically etched using the second photoresist patterns 78 as etch masks until the hard mask layer 40 is exposed. Thus, the second line mask patterns 93 may be formed. Additionally, second anti-reflective patterns 76 may be formed between the second photoresist patterns 78 and the second line mask patterns 93, respectively.

In some embodiments, the second line mask patterns 93 may be formed of a material having an etch selectivity with respect to the first line mask patterns 62. For example, the second line mask patterns 93 may be formed of silicon oxynitride (SiON), silicon oxide (SiO2), silicon nitride (Si3N4), silicon-carbon nitride (SiCN), silicon carbide (SiC), and poly-silicon. At this time, the second line mask patterns 93 may be formed of a different material from the first line mask patterns 62. In some embodiments, the first line mask patterns 62 may be formed of silicon nitride and the second line mask patterns 93 may be formed of silicon oxide. A first portion of the second line mask pattern 93 disposed on the top surface of the first line mask pattern 62 may have a thickness different from that of a second portion of the second line mask pattern 93 disposed between the first line mask patterns 62.

Since the second line mask patterns 93 are formed, first regions R1 and second regions R2 may be defined on the lower layer 20, as illustrated in FIG. 17. The first regions R1 may be exposed by the first and second line mask patterns 62 and 93, and the second regions R2 may correspond to regions overlapped by the first and second line mask patterns 62 and 93. In more detail, the top surface of the hard mask layer 40 may be locally exposed in the first regions R1, and the second line mask patterns 93 may be disposed on the first line mask patterns 62 in the second regions R2.

The second photoresist patterns 78 and the second anti-reflective patterns 76 may be removed after the second line mask patterns 93 are formed.

Figure 23:
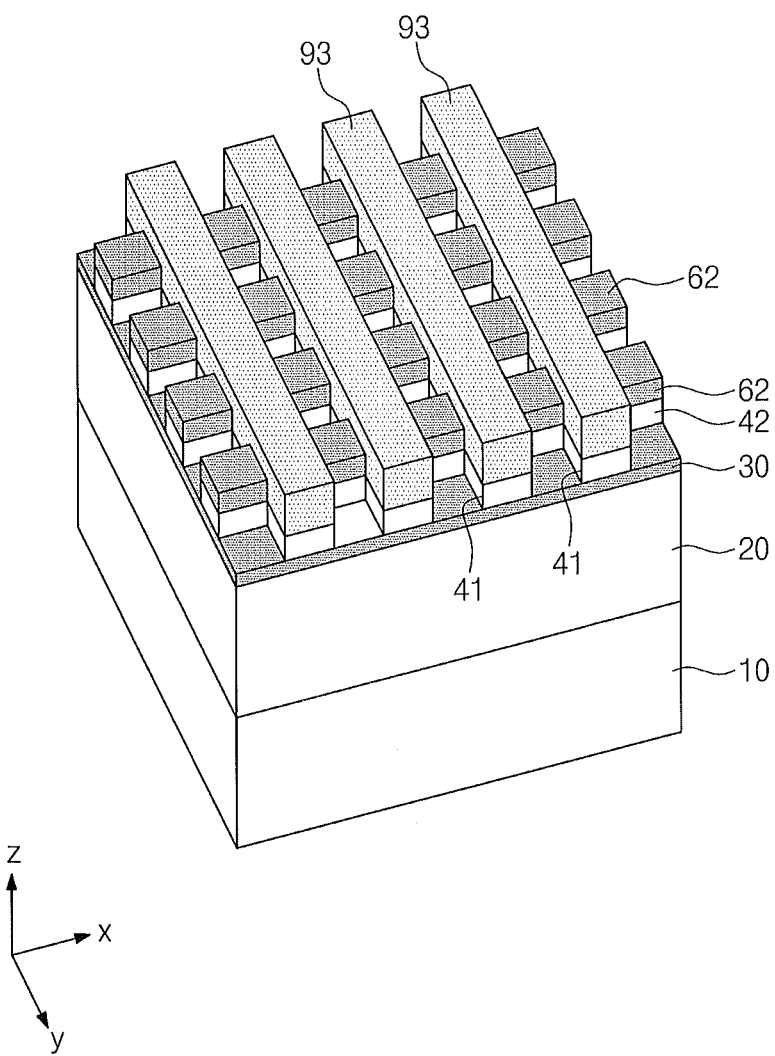

Referring to FIG. 23, a hard mask layer 42 having first holes 41 may be formed using the first and second line mask patterns 62 and 93 as etch masks. In other words, the first regions of the hard mask layer 40, which are exposed by the first and second line mask patterns 62 and 93, may be anisotropically etched to form the first holes 41 exposing the etching stop layer 30, as described with reference to FIGS. 17 and 18. At this time, the process for anisotropically etching the hard mask layer 40 may use an etch recipe having an etch selectivity with respect to the first and second line mask patterns 62 and 93.

Figure 24:
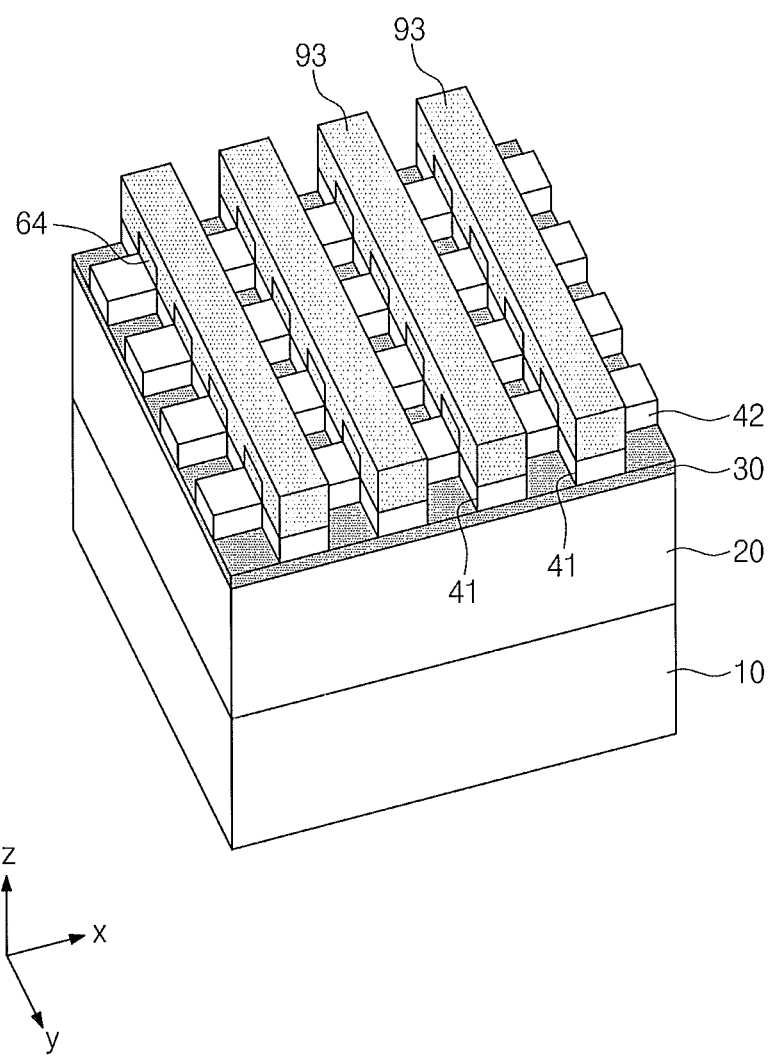

Referring to FIG. 24, the first line mask patterns 62 may be anisotropically etched using the second line mask patterns 93 as etch masks. Thus, the top surface of the hard mask layer 42 may be exposed between the second line mask patterns 93. Additionally, local mask patterns 64 corresponding to portions of the first line mask patterns 62 may be formed in the second regions, which are overlapped by the first and second line mask patterns 62 and 93.

According to some embodiments, the process of anisotropically etching the first line mask patterns 62 may uses an etch recipe having an etch selectivity with respect to the hard, mask layer 42 and the etch stop layer 30. Thus, the lower layer 20 may not be exposed during the process of anisotropically etching the first line mask patterns 62.

Figure 25:
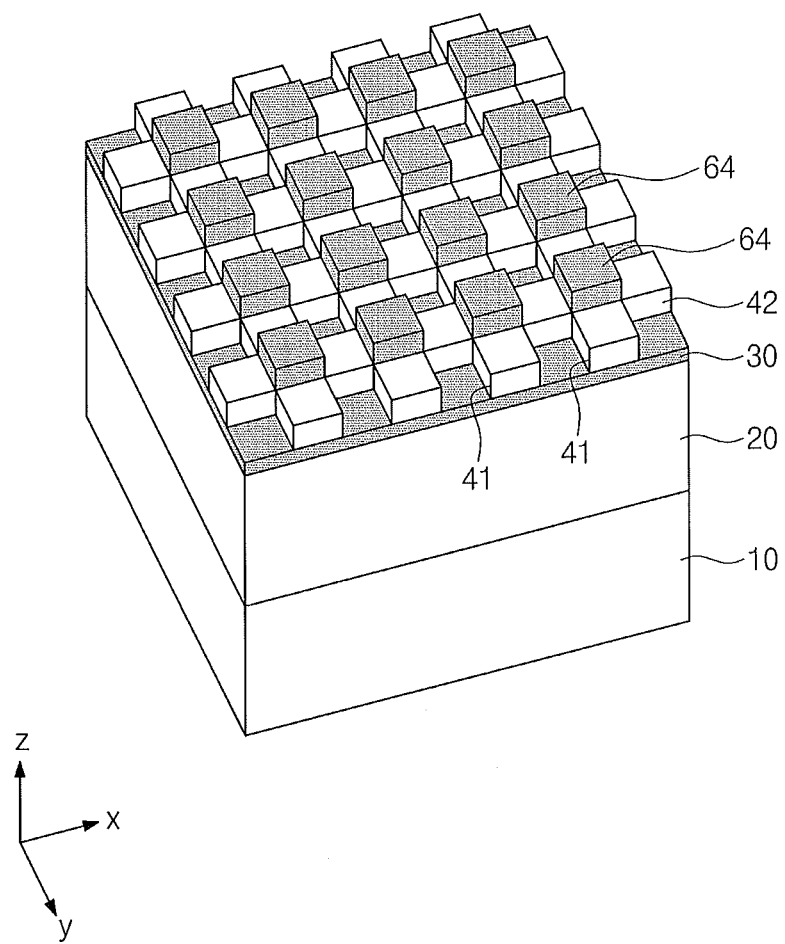

The second line mask patterns 93 may be removed from the hard mask layer 42 having the first holes 41. The second line mask patterns 93 may be removed by a wet etching process or a dry etching process. Since the second line mask patterns 93 have an etch selectivity with respect to the hard mask layer 42, the local mask patterns 64, and the etch stop layer 30, the local mask patterns 64 may remains on the hard mask layer 42 in the second regions, which are overlapped by the first and second line mask patterns 62 and 93, after the removal of the second line mask patterns 93, as illustrated in FIG. 25.

After the local mask patterns 64 are formed, a height of structures on the top surface of the lower layer 20 may be the highest in the second regions but may be the lowest in the first regions.

Figure 26:
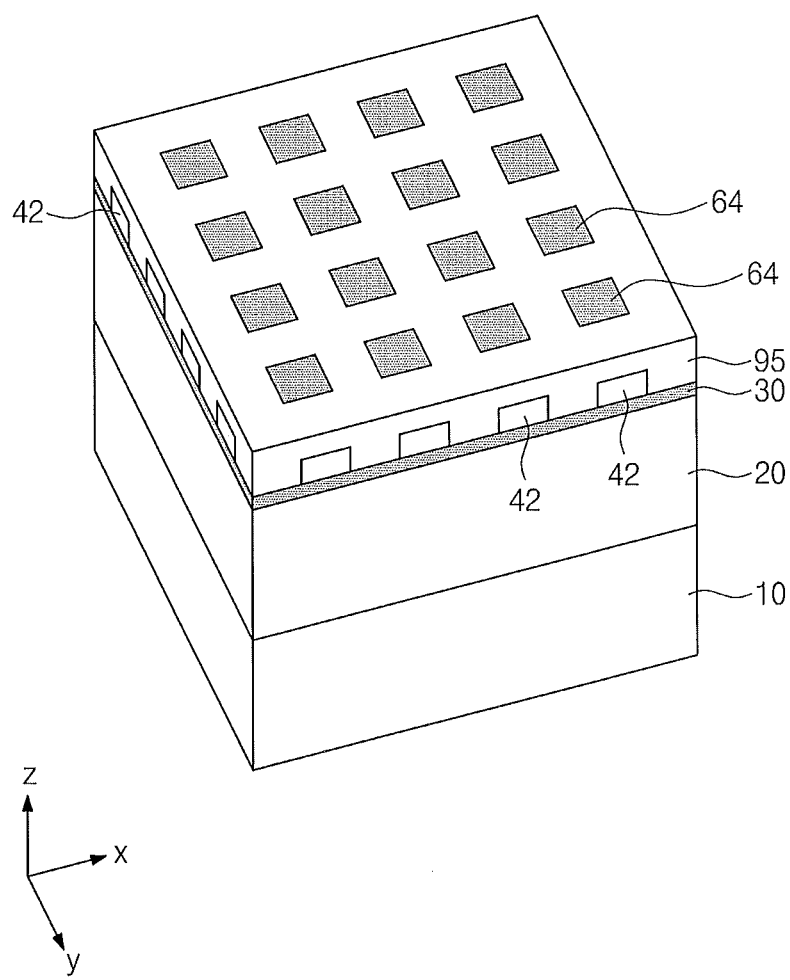

Referring to FIG. 26, a sacrificial layer 95 is formed to fill the first holes 41 and an empty region between the local mask patterns 64, as mentioned with reference to FIG. 9. The sacrificial layer 95 may have a top surface coplanar with top surfaces of the local mask patterns 64. In some embodiments, the sacrificial layer 95 may be formed of a material having an etch selectivity with respect to the hard mask layer 42 and the local mask patterns 64. For example, the sacrificial layer 95 may be formed of a silicon oxide layer, a silicon oxynitride layer, a silicon nitride layer, a crystalline silicon layer, an amorphous silicon layer, a SOH layer, and an amorphous carbon layer (ACL).

Figure 27:
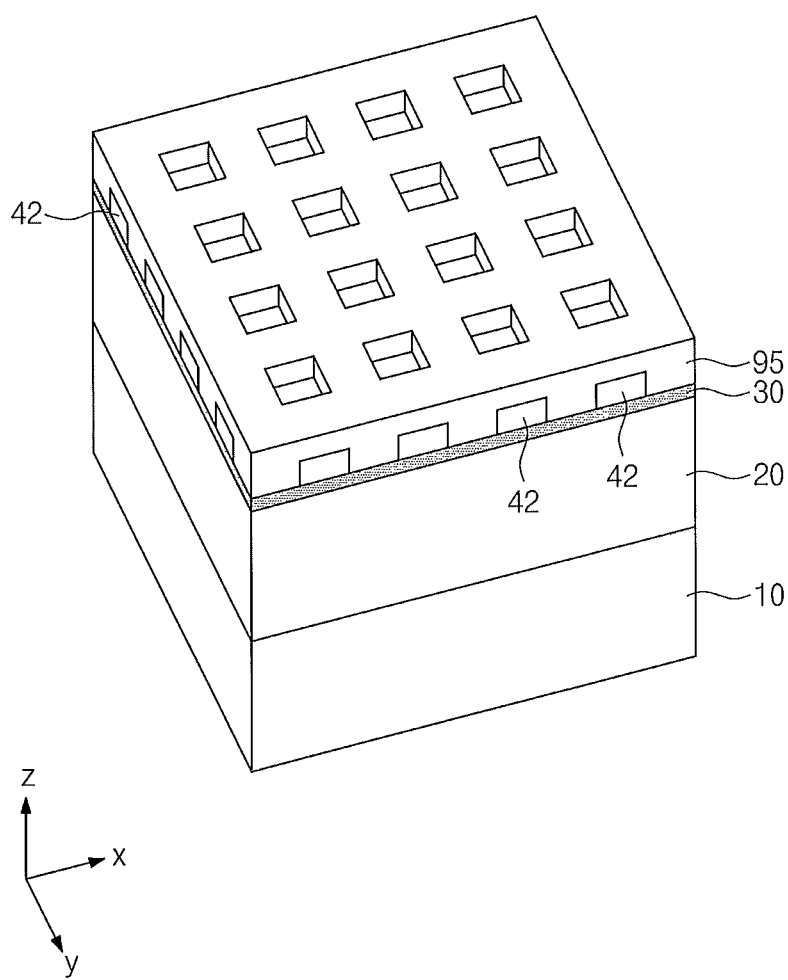

Referring to FIG. 27, the local mask patterns 64 in the sacrificial layer 95 may be removed to form openings locally exposing the top surface of the hard mask layer 40, as described with reference to FIG. 10. The openings in the sacrificial layer 95 may be formed at positions corresponding to the second regions described with reference to FIG. 17.

The hard mask layer 42 exposed by the openings of the sacrificial layer 95 may be anisotropically etched to form second holes (refer to the reference numeral 43 of FIG. 11), as described with reference to FIG. 11. Thus, the hard mask pattern (refer to the reference numeral 44 of FIG. 11) having the first and second holes 41 and 43 may be formed.

A semiconductor device formed using a method according to some embodiments of the present inventive concept is described herein. The semiconductor device according to the some embodiments may include a highly integrated semiconductor memory device, a micro electro mechanical system (MEMS) device, an optoelectronic device, or a processor (e.g., a central process unit (CPU) or a digital signal processor (DSP)). The highly integrated semiconductor memory device may include a dynamic random access memory (DRAM) device, a static RAM (SRAM) device, a phase change RAM (PRAM) device, a resistance RAM (RRAM) device, a magnetic RAM (MRAM) device, a ferroelectric RAM (FRAM) device, and/or a flash memory device. In some embodiments, the semiconductor device may consist of the same kind of semiconductor devices. In some embodiments, the semiconductor device may be a single chip data processing device such as a system-on-chip (SoC) consisting of different kinds of semiconductor devices required for providing one complete function.

Figure 28:
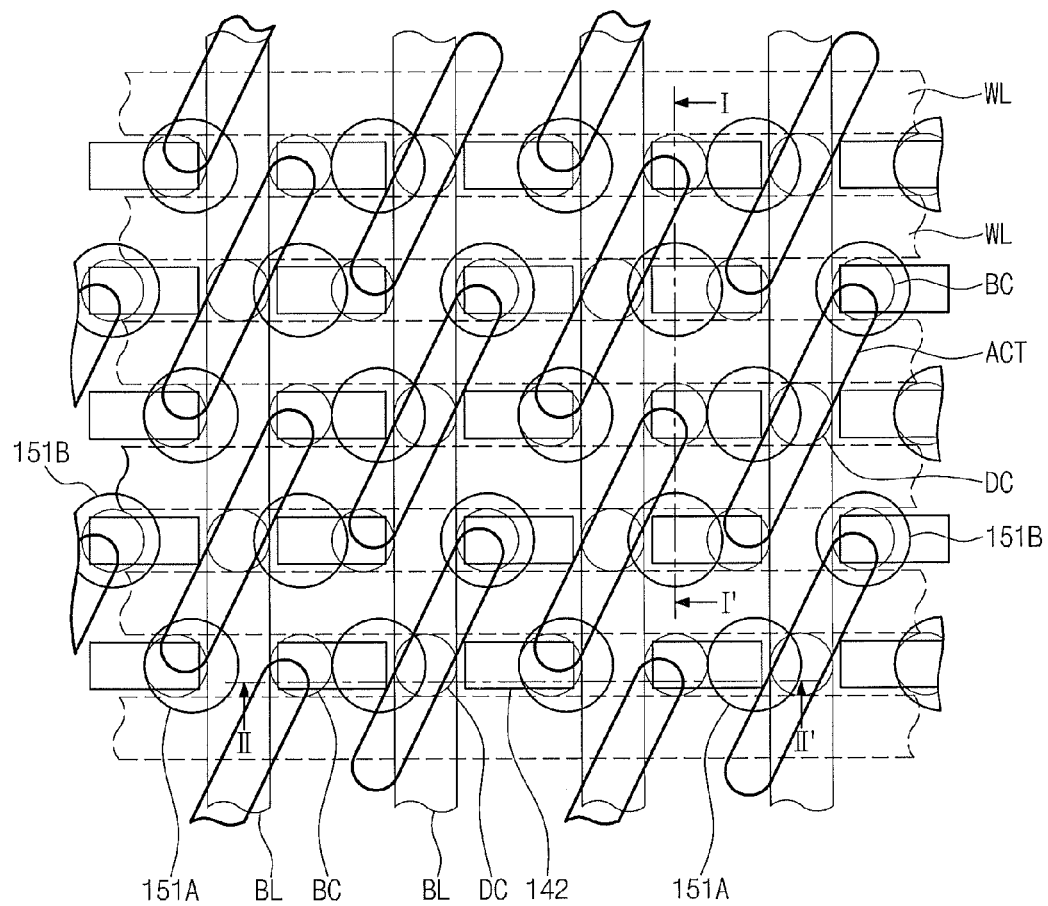
FIG. 28 is a plan view of a semiconductor memory device according to some embodiments of the present inventive concepts.
Figure 29:
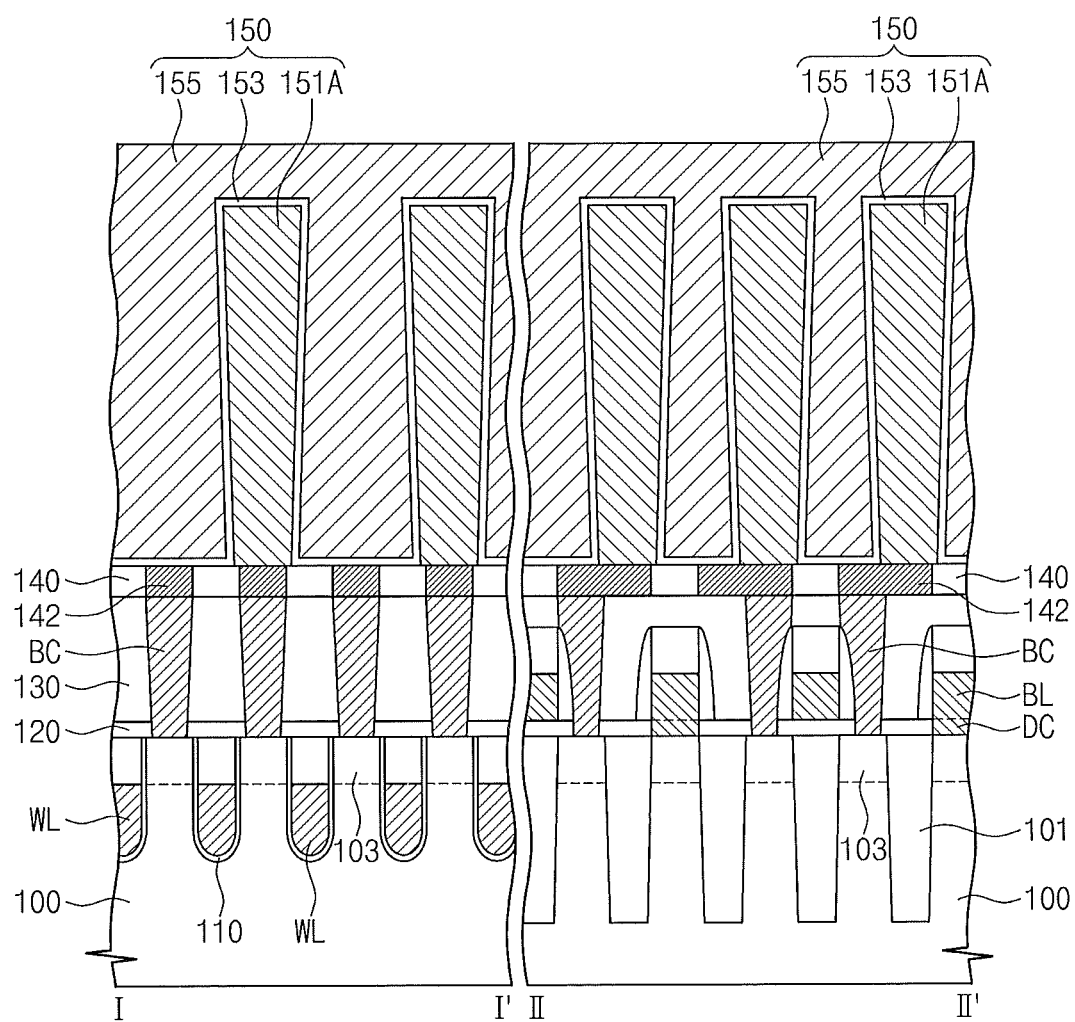
FIG. 29 is a cross-sectional view taken along lines I-I' and II-II' of FIG. 28.

A semiconductor memory device formed using a method according to some embodiments of the present inventive concept will be described with reference to FIGS. 28 and 29. FIG. 28 is a plan view of a semiconductor memory device according to some embodiments of the present inventive concepts. FIG. 29 is a cross-sectional view taken along lines I-I' and II-II' of FIG. 28.

Referring to FIGS. 28 and 29, a semiconductor memory device includes word lines WL, bit lines BL perpendicular to the word lines WL, and memory cells respectively disposed at crossing points of the word lines WL and bit lines BL. In some embodiments, each of the memory cells may include a capacitor 150 including a lower electrode 151A or 151B, an upper electrode 155, and a dielectric layer 153 between the lower electrode 151A or 151B and the upper electrode 155.

In more detail, a device isolation layer 101 may be formed on a semiconductor substrate 100 to define active regions ACT. Each of the active regions ACT may have a bar-shape in a plan view, and a long axis of each active region ACT may extend in a diagonal direction with respect to the word lines WL and the bit lines BL.

The word lines WL may cross over the active regions ACT. In some embodiments, each of the word lines WL may be formed in a recess region recessed from a top surface of the semiconductor substrate 100 by a predetermined depth. A gate insulating layer 110 may be disposed between the word line WL and an inner surface of the recess region. Top surfaces of the word lines WL may be disposed at a lower level than the top surface of the semiconductor substrate 100 and an insulating material may fill the recess region on the word line WL.

Source and drain regions 103 may be formed in the active regions ACT at both sides of each of the word lines WL. The source and drain regions 103 may be dopant regions doped with dopants.

As described above, the word lines WL and the source and drain regions 103 are formed, such that a plurality of MOS transistors may be formed on the semiconductor substrate 100.

The bit lines BL may be disposed to cross over the word lines WL on the semiconductor substrate 100. An interlayer insulating layer 120 may be disposed between the semiconductor substrate 100 and the bit lines BL, and bit line-contact plugs DC may be formed in the interlayer insulating layer 120 to electrically connect some of the source and drain regions 103 to the bit lines BL.

An upper interlayer insulating layer 130 may cover the bit lines BL. Contact plugs BC may be formed in the upper interlayer insulating layer 130 to electrically connect the others of the source and drain regions 103 to data storage elements, respectively. In some embodiments, the contact plugs BC may be disposed on the active region ACT at both sides of the bit line BL.

Contact holes may be formed in the upper interlayer insulating layer 130 and the interlayer insulating layer 120 to expose the others of the source and drain regions 103, respectively. Subsequently, a conductive layer may be deposited to fill the contact holes and then the deposited conductive layer may be planarized to form the contact plugs BC. The contact plugs BC may be formed of poly-silicon doped with dopants, metal, metal nitride, metal silicide, or any combination thereof.

In some embodiments, contact pads 142 may be formed on the contact plugs BC, respectively. The contact pads 142 may be two-dimensionally arranged on the upper interlayer insulating layer 130. The contact pads 142 may increase contacting areas between the contact plugs BC and the lower electrodes 151A and 151B disposed on the contact pads 142. Two adjacent contact pads respectively disposed at both sides of the bit line BL may be enlarged in opposite directions, respectively.

The lower electrode 151A or 151B of the capacitor 150 may be formed on each of the contact pads 142. In some embodiments, the lower electrodes 151A and 151B may be formed by a method according to some embodiments of the present inventive concept. In detail, the lower layer 20 in FIG. 15 may be formed on the contact pads 142 and then a conductive material may fill each of the first and second lower holes 21 and 23 arranged in zigzag pattern. Subsequently, the lower layer 20 may be removed to form the lower electrodes 151A and 151B. That is, the lower electrodes 151A and 151B arranged in zigzag pattern may be formed on the upper interlayer insulating layer 130. In other words, the lower electrodes 151A and 151B may be disposed in the diagonal direction with respect to the word lines WL and the bit line BL.

After the lower electrodes 151A and 151B are formed, the dielectric layer 153 may be formed to conformally cover surfaces of the lower electrodes 151A and 151B. The upper electrode 155 may be formed on the dielectric layer 153.

Figure 30:
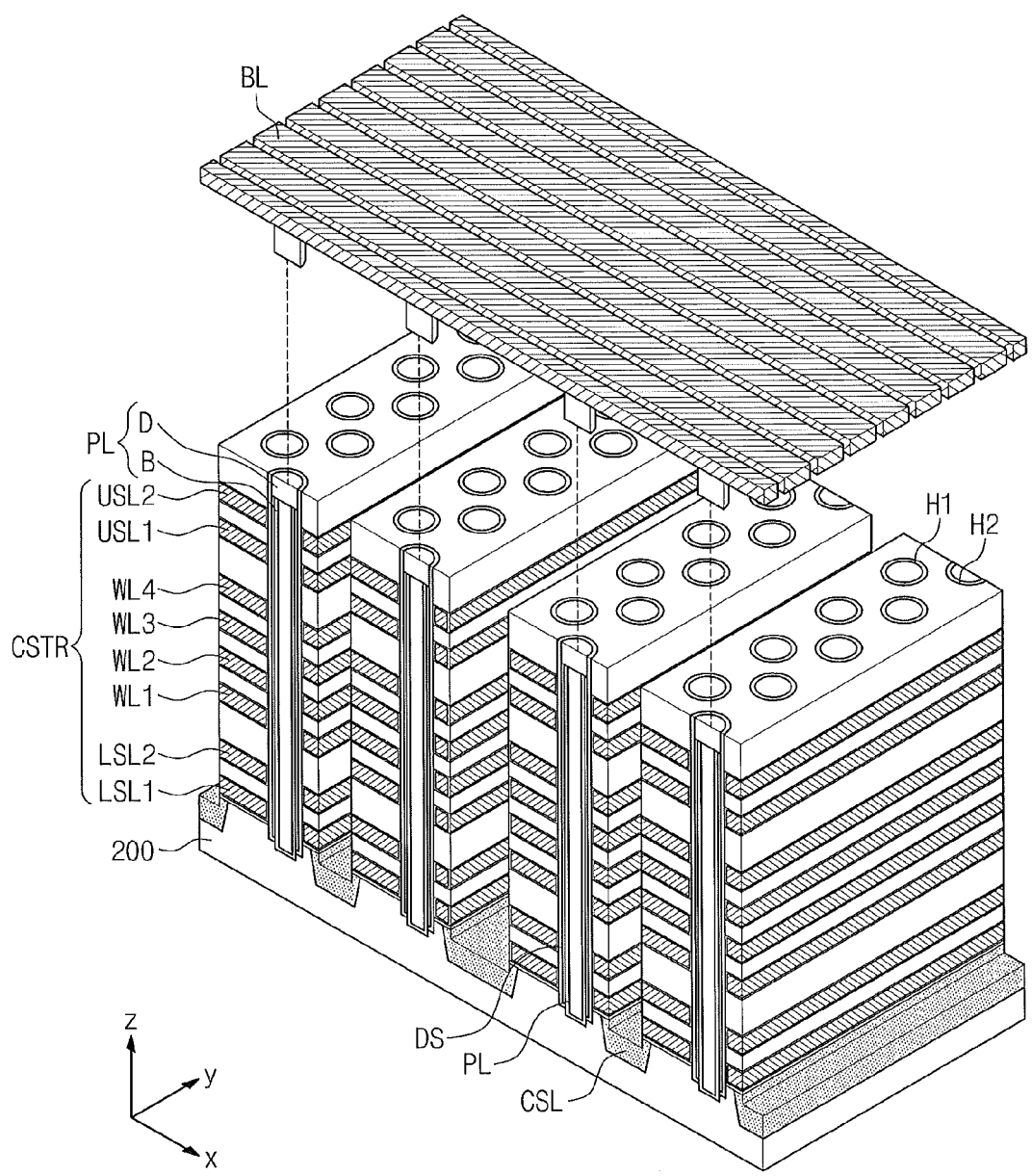
FIG. 30 is a perspective view of a three-dimensional semiconductor memory device according to some embodiments of the present inventive concepts.

FIG. 30 is a perspective view of a three-dimensional semiconductor memory device according to some embodiments of the present inventive concepts. Referring to FIG. 30, a three-dimensional (3D) semiconductor memory device according to some embodiments may include a common source line CSL, a plurality of bit lines BL and a plurality of cell strings CSTR disposed between the common source line CSL and the bit lines BL.

The common source line CSL may be a conductive thin layer disposed on a substrate 200 or a dopant region formed in the substrate 200. The bit lines BL may be conductive patterns (e.g., metal lines) that are spaced apart from the substrate 200 and are disposed over the substrate 200. The bit lines BL may be two-dimensionally arranged and a plurality of the cell strings CSTR may be connected in parallel to each of the bit lines BL. Thus, the cell strings CSTR may be two-dimensionally arranged on the common source line CSL or the substrate 200.

Each of the cell strings CSTR may include a plurality of lower selection lines LSL1 and LSL2, a plurality of word lines WL1 to WL4 and a plurality of upper selection lines USL1 and USL2, which are disposed between the common source line CSL and the bit lines BL. The lower selection lines LSL1 and LSL2, the word lines WL1 to WL4 and the upper selection lines USL1 and USL2 may be conductive patterns stacked on the substrate 200 with insulating layers therebetween.

Additionally, each of the cell strings CSTR may include a semiconductor pillar PL vertically extending from the substrate 200 to the bit line BL. The semiconductor pillar PL is connected to the bit line BL. The semiconductor pillars PL may successively penetrate the upper selection lines USL1 and USL2, the word lines WL1 to WL4, and the lower selection lines LSL1 and LSL2. In other words, the semiconductor pillars PL may successively penetrate a plurality of conductive patterns stacked on the substrate 10. The semiconductor pillar PL may include a body portion B and dopant regions formed at one end portion or both end portions of the body portion B. For example, a drain region D may be formed in a top portion of the semiconductor pillar PL (i.e., between the body portion B and the bit line BL).

A data storage layer DS may be disposed between the word lines WL1 to WL4 and the semiconductor pillars PL. In some embodiments, the data storage layer DS may include a charge storage layer. For example, the data storage layer DS may include a trap insulating layer, a floating gate electrode, and/or an insulating layer including conductive nano dots.

A dielectric layer used as a gate insulating layer may be disposed between each of the lower selection lines LSL1 and LSL2 and the semiconductor pillar PL and/or between each of the upper selection lines USL1 and USL2 and the semiconductor pillar PL. The dielectric layer may be formed of the same material as the data storage layer DS or may be a gate insulating layer (e.g., a silicon oxide layer) for a general MOSFET.

In the structure described above, the semiconductor pillars PL, the lower selection lines LSL1 and LSL2, the word lines WL1 to WL4, and the upper selection lines USL1 and USL2 may constitute MOSFETs using the semiconductor pillars PL as channel regions. Alternatively, the semiconductor pillars PL, the lower selection lines LSL1 and LSL2, the word lines WL1 to WL4, and the upper selection lines USL1 and USL2 may constitute MOS capacitors. In other words, the cell string CSTR may include lower and upper selection transistors constituted by the lower and upper selection transistors LSL1, LSL2, USL1, and USL2 and cell transistors constituted by the word lines WL1 to WL4. The lower selection transistors, the cell transistors, and the upper selection transistors in the cell string CSTR may be connected in series to each other.

The semiconductor pillars PL of the 3D semiconductor memory device described above may be formed using a method for forming the fine patterns according to some embodiments of the present inventive concept.

In more detail, a stack structure may be formed on the substrate 200. The stack structure may be provided for the lower selection lines LSL1 and LSL2, the word lines WL1 to WL4, and the upper selection lines USL1 and USL2. The stack structure may include insulating layers and conductive layers that are alternately and repeatedly stacked on the substrate 200. The stack structure may correspond to the lower layer described in FIGS. 1 to 16. As described with reference to FIGS. 1 to 16, the first and second lower holes arranged in zigzag pattern may be formed in the stack structure. The data storage layer DS and the semiconductor pillars PL may be formed in the first and second lower holes of the stack structure.

Figure 31:
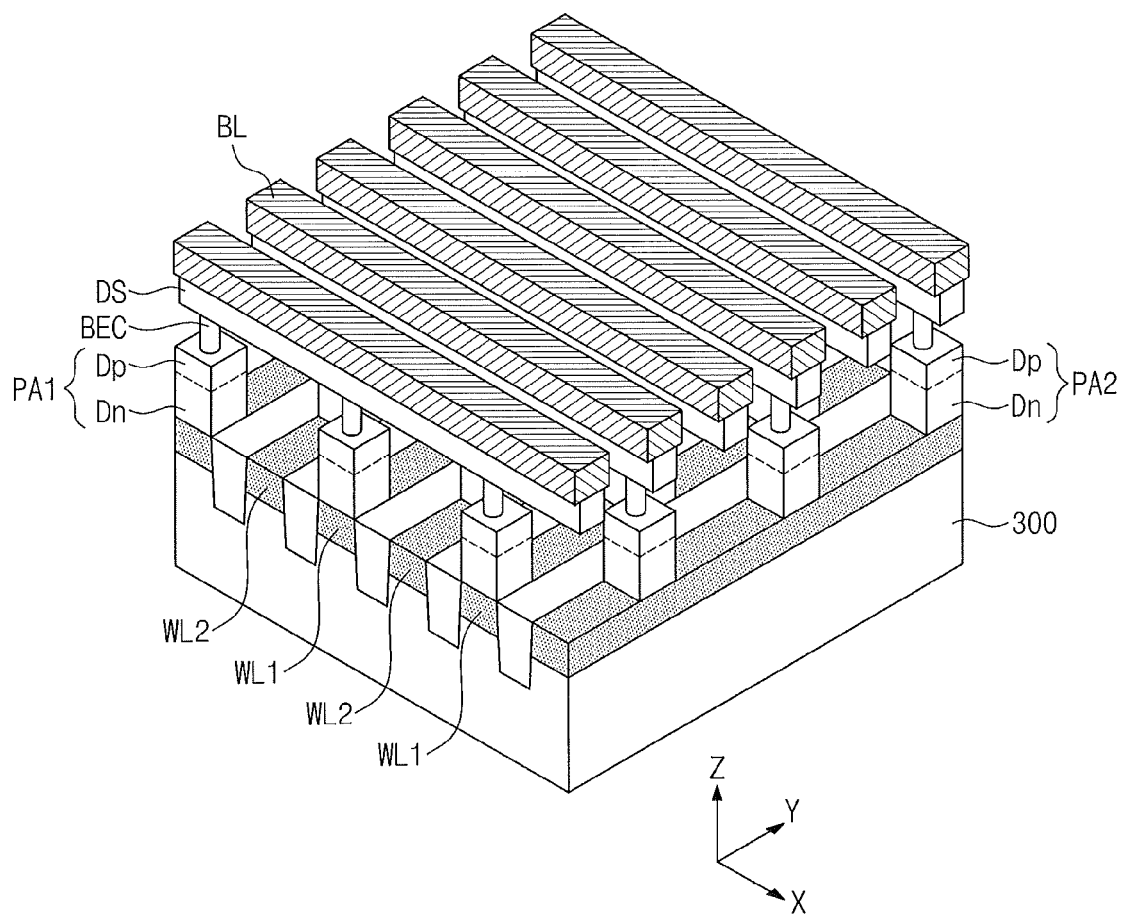
FIG. 31 is a perspective view of a variable resistance memory device according to some embodiments of the present inventive concepts.

FIG. 31 is a perspective view of a variable resistance memory device according to some embodiments of the present inventive concepts. Referring to FIG. 31, a semiconductor memory device may include a semiconductor substrate 300, lower interconnections WL1 and WL2 disposed on the semiconductor substrate 300, upper interconnections BL crossing over the lower interconnections WL1 and WL2, selection elements disposed in crossing regions of the lower interconnections WL1 and WL2 and the upper interconnections BL, and memory elements DS between the selection elements and the upper interconnections BL. The selection elements may be two-dimensionally arranged on the semiconductor substrate 300. Each of the selection elements may control a flow of a current passing through the memory element connected thereto.

In more detail, the lower interconnections WL1 and WL2 may have line shapes extending in a y-axis direction on the semiconductor substrate 300. In some embodiments, the lower interconnections WL1 and WL2 may be dopant regions which are formed by heavily doping portions of the semiconductor substrate 300 with dopants. In this case, the lower interconnections WL1 and WL2 may have a conductivity type opposite to that of the semiconductor substrate 300.

In some embodiments, the selection elements may include semiconductor patterns PA1 and PA2 formed by a method for forming fine patterns according to some embodiments of the present inventive concepts. In other words, a semiconductor material may be formed to fill each of the first and second lower holes 21 and 23 of the lower layer 20 of FIG. 15 and then the lower layer 20 may be removed to form the semiconductor patterns PA1 and PA2. Thus, the semiconductor patterns PA1 and PA2 may be arranged in zigzag pattern on the semiconductor substrate 300.

In more detail, the selection elements includes first semiconductor patterns PA1 disposed on odd-numbered lower interconnections WL1 and second semiconductor patterns PA2 disposed on even-numbered lower interconnections WL2. In other words, each of a pitch of the first semiconductor patterns PA1 and a pitch of the second semiconductor patterns PA2 in a first direction (i.e., an x-axis direction) may be equal to or greater than twice a pitch of the lower interconnections WL1 and WL2. The second semiconductor patterns PA2 may be disposed on the even-numbered lower interconnections WL2 and may be disposed in a diagonal direction with respect to the first semiconductor patterns PA1.

Each of the first and second semiconductor patterns PA1 and PA2 may include an upper dopant region Dp and a lower dopant region Dn. The upper and lower dopant regions Dp and Dn may have conductivity types opposite to each other. For example, the lower dopant region Dn may have the same conductivity type as the lower interconnections WL1 and WL2, and the upper dopant region Dp may have a conductivity type opposite to that of the lower dopant region Dn. Thus, a PN junction may be formed in each of the first and second semiconductor patterns PA1 and PA2. Alternatively, an intrinsic region may be disposed between the upper dopant region Dp and the lower dopant region Dn, such that a PN junction may be formed in each of the first and second semiconductor patterns PA1 and PA2. In some embodiments, a bipolar transistor having a PNP or NPN structure may be realized by the semiconductor substrate 300, each of the lower interconnections WL1 and WL2, and each of the first and second semiconductor patterns PA1 and PA2.

Lower electrodes BEC, the memory elements DS and the upper interconnections BL may be disposed on the first and second semiconductor patterns PA1 and PA2. The upper interconnections BL may cross over the lower interconnections WL1 and WL2 and may be disposed on the memory elements DS. The upper interconnections BL may be electrically connected to the memory elements DS.

In some embodiments, the memory element DS may be formed to be substantially parallel to the upper interconnection BL and may be connected to a plurality of the lower electrodes BEC. Alternatively, the memory elements DS may be two-dimensionally arranged. In other words, each of the memory elements DS may be disposed on each of the first and second semiconductor patterns PA1 and PA2 in one-to-one correspondence. The memory element DS may be a variable resistance pattern capable of switching to any one of two resistance states by an electrical pulse applied to the memory element DS. In some embodiments, the memory element DS may include a phase-change material of which a crystalline state is changed depending on the amount of a current. In some embodiments, the memory element DS may include a perovskite compound, a transition metal oxide, or a magnetic material (e.g., a ferromagnetic material). If the memory element DS includes the magnetic material, the memory element DS may further include an anti-ferromagnetic material.

Each of the lower electrodes BEC may be disposed between each of the first and second semiconductor patterns PA1 and PA2 and the memory element DS thereon. A planar area of the lower electrode BEC may be less than a planar area of each of the first and second semiconductor patterns PA1 and PA2 or a planar area of the memory element DS.

In some embodiments, each of the lower electrodes BEC may have a pillar-shape. In some embodiments, a shape of the lower electrodes BEC may be modified to reduce a cross-sectional area of the lower electrode BEC. For example, each of the lower electrodes BEC may include a three-dimensional structure such as a U-shape, an L-shape, a hollow cylindrical structure, a ring structure, or a cup structure.

An ohmic layer may be disposed between each of the lower electrodes BEC and each of the first and second semiconductor patterns PA1 and PA2 to reduce a contact resistance. For example, the ohmic layer may include a metal silicide such as titanium silicide, cobalt silicide, tantalum silicide, or tungsten silicide.

Figure 32:
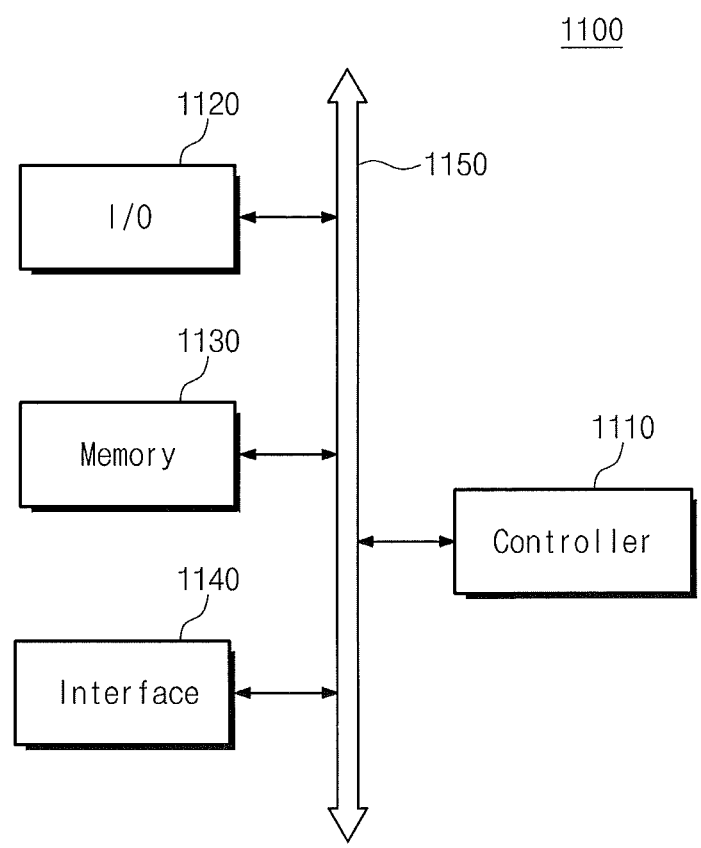
FIG. 32 is a block diagram of an example of an electronic system including a semiconductor device to some embodiments of the present inventive concepts.

FIG. 32 is a block diagram of an example of an electronic system including a semiconductor device to some embodiments of the present inventive concepts. Referring to FIG. 32, an electronic system 1100 according to some embodiments of the present inventive concept may include a controller 1110, an input/output (I/O) unit 1120, a memory device 1130, an interface unit 1140 and a data bus 1150. At least two of the controller 1110, the I/O unit 1120, the memory device 1130 and the interface unit 1140 may communicate with each other through the data bus 1150. The data bus 1150 may correspond to a path through which electrical signals are transmitted. The controller 1110, the I/O unit 1120, the memory device 1130, and/or the interface unit 1140 may include the semiconductor devices according to some embodiments of the present inventive concept.

The controller 1110 may include at least one of a microprocessor, a digital signal processor, a microcontroller or another logic device. Another logic device may have a similar function to any one of the microprocessor, the digital signal processor and the microcontroller. The I/O unit 1120 may include a keypad, a keyboard and/or a display unit. The memory device 1130 may store data and/or commands. The interface unit 1140 may transmit electrical data to a communication network or may receive electrical data from a communication network. The interface unit 1140 may operate by wireless or cable. For example, the interface unit 1140 may include an antenna for wireless communication or a transceiver for cable communication. The electronic system 1100 may further include a fast DRAM device and/or a fast SRAM device which acts as a cache memory for improving an operation of the controller 1110.

The electronic system 1100 may be applied to a personal digital assistant (PDA), a portable computer, a web tablet, a wireless phone, a mobile phone, a digital music player, a memory card or other electronic products. The other electronic products may receive or transmit information data by wireless.

Figure 33:
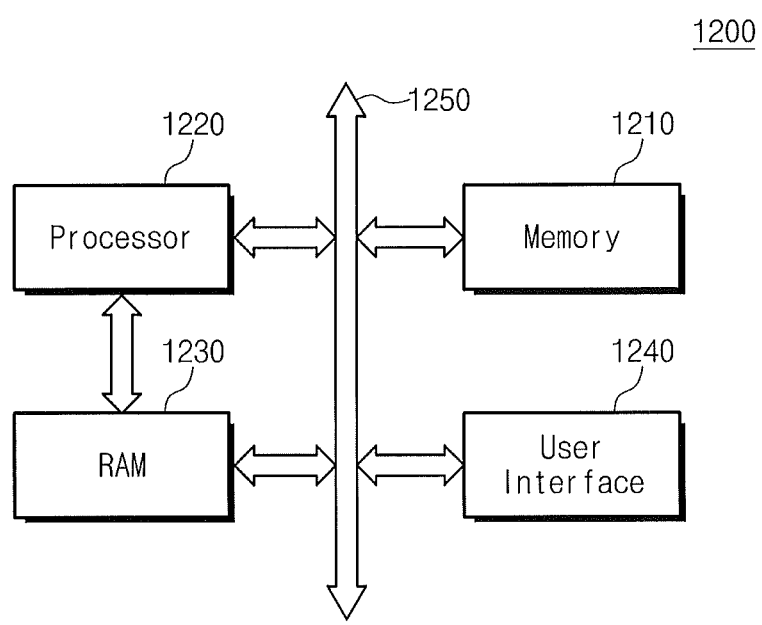
FIG. 33 is a block diagram of an example of an electronic system including a semiconductor device to some embodiments of the present inventive concepts.

FIG. 33 is a block diagram of an example of an electronic system including a semiconductor device to some embodiments of the present inventive concepts. Referring to FIG. 33, an electronic system 1200 may include at least one of the semiconductor devices according to some embodiments of the present inventive concept. The electronic system 1200 may include a mobile device or a computer. For example, the electronic system 1200 may include a memory system 1210, a processor 1220, a random access memory (RAM) device 1230, and a user interface unit 1240 that communicate with each other through a data bus 1250. The processor 1220 may execute a program and may control the electronic system 1200. The RAM device 1230 may be used as an operation memory. For example, the processor 1220 and the RAM device 1230 may include the semiconductor devices according to some embodiments of the present inventive concept, respectively. Alternatively, the processor 1220 and the RAM device 1230 may be included in one package. The user interface unit 1240 may be used for inputting/outputting data into/from the electronic system 1200. The memory system 1210 may store data outputted from an external system or data processed by the processor 1220 or a code for operating the processor 1220. The memory system 1210 may include a controller and a memory device.

The electronic system 1200 may be realized as a mobile system, a personal computer, an industrial computer, or a logic system performing various functions. For example, the mobile system may be one of a personal digital assistant (PDA), a portable computer, a web tablet, a mobile phone, a wireless phone, a laptop computer, a memory card, a digital music player, and an information transmitting/receiving system. If the electronic system 1200 performs wireless communications, the electronic system 1200 may be used in a communication interface protocol of a three-generation communication system CDMA, GSM, NADC, E-TDMA, WCDMA, or CDMA2000.

According to some embodiments of the present inventive concept, the fine patterns may be formed to be arranged in zigzag pattern by using the line-and-space patterns. Some of the fine patterns may be formed in the regions exposed by the line mask patterns crossing each other. Additionally, the local mask patterns formed of portions of the line mask patterns may be formed in the regions corresponding to regions overlapped by the line mask patterns crossing each other, and then the others of the fine patterns may be formed at the positions of the local mask patterns. As a result, the fine patterns arranged in zigzag pattern may be formed by a simple process. Highly integrated semiconductor devices may be formed using a method for forming the fine patterns according to some embodiments of the present inventive concepts.

The above-disclosed subject matter is to be considered illustrative, and not restrictive, and the appended claims are intended to cover all such modifications, enhancements, and other embodiments, which fall within the true spirit and scope of the inventive concept. Thus, to the maximum extent allowed by law, the scope of the present inventive concept is to be determined by the broadest permissible interpretation of the following claims and their equivalents, and shall not be restricted or limited by the foregoing description.

What is claimed is:

1. A method for forming a semiconductor device, the method comprising:
   forming a hard mask layer comprising a plurality of first holes spaced apart from each other in a first direction and a second direction on a substrate;
   forming a plurality of local mask patterns on the hard mask layer, wherein the plurality of local mask patterns are offset from the plurality of first holes in the first direction and the second direction;
   forming a sacrificial layer on the hard mask layer filling the plurality of first holes and surrounding the plurality of local mask patterns;
   removing the plurality of local mask patterns to form a plurality of openings in the sacrificial layer exposing portions of the hard mask layer; and
   anisotropically etching the portions of the hard mask layer to form a plurality of second holes.

2. The method of claim 1, further comprising:
   forming a plurality of spacers on respective ones of sidewalls of the pluralities of first and second holes.

3. The method of claim 1, wherein forming the hard mask layer comprising the plurality of first holes comprises:
   forming a plurality of first line mask patterns extending in the first direction on the hard mask layer;
   forming a plurality of second line mask patterns crossing over the plurality of first line mask patterns; and
   anisotropically etching the hard mask layer using the pluralities of first and second line mask patterns as an etch mask.

4. The method of claim 3, wherein a width of each of the plurality of first line mask patterns is equal to a width of each of the plurality of second line mask patterns.

5. The method of claim 3, wherein forming the plurality of local mask patterns comprises:
   performing a blanket anisotropic etching process on the pluralities of first and second line mask patterns to leave portions of the plurality of first line mask patterns overlapped by the plurality of second line mask patterns.

6. The method of claim 3, wherein forming the plurality of local mask patterns comprises:
   etching the plurality of first line mask patterns to leave portions of the plurality of first line mask patterns under the plurality of second line mask patterns.

7. The method of claim 1, further comprising:
   forming a lower layer between the substrate and the hard mask layer; and
   anisotropically etching the lower layer using the hard mask layer comprising the pluralities of first and second holes as an etch mask to form pluralities of first and second lower holes in the lower layer.

8. The method of claim 7, further comprising:
   filling each of the pluralities of first and second lower holes in the lower layer with a filling material to form a plurality of fine patterns in respective ones of the pluralities of first and second lower holes, wherein the plurality of fine patterns are arranged in zigzag pattern; and
   removing the lower layer.

9. A method for forming a semiconductor device, the method comprising:
   forming a plurality of first line mask patterns extending in a first direction on a hard mask layer;
   forming a plurality of second line mask patterns on the plurality of first line mask patterns extending in a second direction perpendicular to the first direction, wherein the hard mask layer comprises a plurality of first regions exposed by the pluralities of first and second line mask patterns and a plurality of second regions overlapped by the pluralities of first and second line mask patterns;
   forming a plurality of first holes by etching the plurality of first regions of the hard mask layer; and
   forming a plurality of second holes by etching the plurality of second regions of the hard mask layer.

10. The method of claim 9, wherein a width of each of the plurality of first line mask patterns is equal to a width of each of the plurality of second line mask patterns.

11. The method of claim 9, further comprising:
    forming a plurality of spacers on respective ones of sidewalls of the pluralities of first and second holes.

12. The method of claim 9, wherein forming the plurality of second holes comprises:

forming a plurality of local mask patterns in the plurality of second regions by etching the plurality of first line mask patterns after the plurality of first holes are formed;

forming a sacrificial layer on the hard mask layer filling the plurality of first holes and surrounding the plurality of local mask patterns;

selectively removing the plurality of local mask patterns to form a plurality of openings exposing portions of the hard mask layer; and anisotropically etching the portions of the hard mask layer.

13. The method of claim 12, wherein the pluralities of first and second line mask patterns have an etch selectivity with respect to the hard mask layer, wherein the first and second line mask patterns comprise a same material, and wherein forming the local mask patterns comprises anisotropically etching the pluralities of first and second line mask patterns concurrently.

14. The method of claim 13, wherein each of the plurality of first line mask patterns is thinner than each of the plurality of second line mask patterns.

15. The method of claim 12, wherein the plurality of first line mask patterns have an etch selectivity with respect to the plurality of second line mask patterns, and wherein forming the plurality of local mask patterns comprises:

anisotropically etching the plurality of first line mask patterns using the plurality of second line mask patterns as an etch mask; and removing the plurality of second line mask patterns.

16. A method of forming an integrated circuit device, the method comprising:

forming a mask layer on a substrate;

forming a plurality of first line patterns extending in a first direction on the mask layer;

forming a plurality of second line patterns on the mask layer and the plurality of first line patterns, wherein the plurality of second line patterns extend in a second direction different from the first direction;

forming a plurality of first holes in the mask layer by etching the mask layer exposed by the pluralities of first and second line patterns;

forming a plurality of local mask patterns by etching the plurality of first line patterns exposed by the plurality of second line patterns, wherein the plurality of local mask patterns comprise remaining portions of the plurality of first line patterns;

forming a sacrificial layer on the mask layer surrounding the plurality of local mask patterns so as to expose uppermost surfaces of the plurality of local mask patterns;

forming a plurality of second holes in the sacrificial layer exposing the mask layer by removing the plurality of local mask patterns; and forming a plurality of third holes in the mask layer by etching the mask layer through the plurality of second holes.

17. The method of claim 16, wherein the first direction is perpendicular to the second direction.

18. The method of claim 16, wherein forming the plurality of second holes comprises:

forming a plurality of preliminary holes in the sacrificial layer exposing the mask layer by removing the plurality of local mask patterns; and forming a plurality of spacers on respective ones of sidewalls of the plurality of preliminary holes.

19. The method of claim 16, further comprising forming a plurality of spacers on respective ones of sidewalls of the pluralities of first and third holes in the mask layer.

20. The method of claim 16, wherein forming the plurality of first holes in the mask layer comprises etching the mask layer using the pluralities of first and second line patterns as an etch mask.

21. The method of claim 16, wherein forming the plurality of local mask patterns comprises:

etching the plurality of first line patterns using the plurality of second line patterns as an etch mask, wherein the plurality of first line patterns have an etching selectivity with respect to the plurality of second line patterns; and removing the plurality of second line patterns.

22. The method of claim 16, wherein the mask layer comprises a hard mask layer.

23. The method of claim 22, further comprising forming an etch stop layer between the substrate and the mask layer, wherein the etch stop layer has an etch selectivity with respect to the mask layer.

24. The method a claim 16, wherein forming the plurality of first line patterns and forming the plurality of second line patterns comprises:

forming an organic mask layer on the mask layer;

forming a plurality of first mask line patterns extending in the first direction on the organic mask layer, wherein an upper surface defined by the organic mask layer and the plurality of first mask line patterns is flat;

forming the plurality of second line patterns on the organic mask layer and the plurality of first mask line patterns, wherein the organic mask layer has an etching selectivity with respect to the plurality of first mask line patterns and the plurality of second line patterns; and forming an organic mask pattern by etching the organic mask layer exposed by the plurality of first mask line patterns and the plurality of second line patterns until the mask layer is exposed.

25. The method of claim 24, wherein forming the organic mask layer and forming the plurality of first mask line patterns comprises:

forming a first organic mask layer on the mask layer;

forming a preliminary mask layer on the first organic mask layer;

forming a plurality of trenches extending in the first direction by etching the preliminary mask layer and the first organic mask layer, wherein the plurality of first mask line patterns comprises remaining portions of the preliminary mask layer;

forming a second organic mask layer in the plurality of trenches, wherein the first and second organic mask layers comprise the organic mask layer.

26. The method of claim 24, further comprising:

forming a plurality of preliminary local mask patterns by concurrently etching the plurality of second line patterns and the plurality of first mask line patterns exposed by the plurality of second line patterns, wherein the plurality of preliminary local mask patterns comprises remaining portions of the plurality of first mask line patterns.

27. The method of claim 26, wherein forming the plurality of first holes in the mask layer comprises etching the mask layer using the plurality of preliminary local mask patterns and the organic mask patterns as an etching mask.

28. The method of claim 26, wherein forming the plurality of local mask patterns comprises etching the organic mask pattern using the plurality of preliminary local mask patterns as an etching mask until the mask layer is exposed, wherein the plurality of local mask patterns comprise respective ones of the plurality of preliminary local mask patterns and remaining portions of the organic mask pattern under the respective ones of the plurality of preliminary local mask patterns.

29. The method of claim 24, wherein forming the organic mask layer comprises forming an organic layer comprising carbon and a carbon content is in a range of about 80wt % to about 99wt %.

\* \* \* \* \*